(12) United States Patent
Dykaar

(10) Patent No.: US 10,673,203 B2
(45) Date of Patent: Jun. 2, 2020

(54) ALIGNMENT METHODS FOR LASER DIODES

(71) Applicant: North Inc., Kitchener (CA)

(72) Inventor: Douglas Raymond Dykaar, Waterloo (CA)

(73) Assignee: North Inc., Kitchener, ON (CA)

( * ) Notice: Subject to any disclaimer, the term of this patent is extended or adjusted under 35 U.S.C. 154(b) by 0 days.

(21) Appl. No.: 16/296,779

(22) Filed: Mar. 8, 2019

(65) Prior Publication Data

US 2019/0280458 A1    Sep. 12, 2019

Related U.S. Application Data

(60) Provisional application No. 62/641,055, filed on Mar. 9, 2018.

(51) Int. Cl.
| | |
|---|---|
| *H01S 3/10* | (2006.01) |
| *H01S 5/022* | (2006.01) |
| *H01S 5/00* | (2006.01) |
| *H01S 5/40* | (2006.01) |

(52) U.S. Cl.
CPC ........ *H01S 5/02268* (2013.01); *H01S 5/0014* (2013.01); *H01S 5/0071* (2013.01); *H01S 5/02252* (2013.01); *H01S 5/02256* (2013.01); *H01S 5/02288* (2013.01); *H01S 5/4012* (2013.01); *H01S 5/005* (2013.01); *H01S 5/4025* (2013.01); *H01S 5/4093* (2013.01)

(58) Field of Classification Search
CPC .. H01S 5/02268; H01S 5/0014; H01S 5/0071; H01S 5/02252; H01S 5/02288; H01S 5/4012; H01S 5/005; H01S 5/4093; H01S 5/02256; H01S 5/4025
See application file for complete search history.

(56) References Cited

U.S. PATENT DOCUMENTS

| 2002/0118713 A1* | 8/2002 | Shirai | B82Y 20/00 372/34 |
| 2002/0172243 A1* | 11/2002 | Ono | H01S 5/0014 372/29.02 |
| 2011/0096543 A1* | 4/2011 | Yabe | G02B 6/4201 362/235 |
| 2014/0321490 A1* | 10/2014 | Akagi | H01S 5/4025 372/38.01 |

* cited by examiner

*Primary Examiner* — Kinam Park
(74) *Attorney, Agent, or Firm* — Thomas Mahoa

(57) ABSTRACT

The present disclosure generally relates to methods of assembling projectors, and more particularly, to methods of aligning laser diodes in laser projectors. Implementations of the present disclosure include positioning an alignment beam and a photodetector in an optical path of the projector. The alignment beam propagates from an alignment light source through a location where a laser diode is to be mounted. A laser diode is then initially positioned in the optical path with a laser cavity of the diode acting as a passive waveguide during the assembly process. The laser diode is then fixed in place at a position and, or, an orientation that corresponds to light from the alignment beam passing through a laser cavity of the diode to be aligned and registering at least a minimum threshold value of a measure at the photodetector.

20 Claims, 8 Drawing Sheets

ALIGNMENT METHODS FOR LASER DIODES

TECHNICAL FIELD

The present methods generally relate to assembling laser projectors and more particularly relate to aligning laser diodes during assembly of laser projectors using laser diodes as a light source.

BACKGROUND

Description of the Related Art

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional laser projectors, the at least one controllable mirror may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

Certain conventional laser projector systems employ one or more laser diodes as the laser light source. In systems that utilize a single laser diode, the laser diode is precisely positioned and oriented such that the laser beam from the laser diode aligns with an intended optical path through the laser projector system. In systems that utilize multiple laser diodes, aligning the diodes is a greater challenge because the respective beams from each diode should preferably be collinear at an output of the projector, which necessarily requires careful positioning and orientation of each of the multiple laser diodes. Precise alignment of the one or more laser diodes is typically accomplished through manual placement of the diodes or through an automated system while providing power to the laser diodes. However, both techniques suffer from deficiencies.

For example, manual placement of the one or more laser diodes is slow and expensive, which drives up the end cost of the product incorporating the one or more laser diodes. Further, manual placement may be prone to human errors in alignment, which results in a less effective or even faulty end product and, or, further drives up manufacturing costs to fix any such errors. Machines have been implemented to automate this manual process, thus increasing the precision of alignment, but such machines are complex to operate and are often cost-prohibitive. Further, automated machines can be difficult to employ in projectors with a compact form factor, such as a picoprojector used in a wearable heads-up display. In both methods, the complexity is amplified by the need to power the laser diodes during positioning and orientation. In other words, it is very difficult to maintain an electrical connection with one or more laser diodes while also aligning the diodes in a precise location and orientation.

As such, there remains a need for a simplified method of aligning laser diodes in a laser projector system that is efficient in terms of time and cost, and that also allows for automation without the use of expensive and complex machinery.

BRIEF SUMMARY

A first exemplary implementation of a method of assembly for a device, such as a laser projector, having a body, at least a first location at which a first laser diode is to be mounted, and an optical path that extends through at least a portion of the body may be summarized as including: aiming an alignment beam produced by an alignment light source to pass through the first location at which the first laser diode is to be mounted; positioning and orienting a photodetector with respect to the first location at which the first laser diode is to be mounted to detect any portion of the alignment beam that successfully passes through the first location; initially positioning and orienting the first laser diode at the first location, the first laser diode including a first side, a second side, and a laser cavity that provides an optical passage through the first laser diode from the first side to the second side thereof; monitoring a measure of the alignment beam which passes through the laser cavity of the first laser diode, if any, detected by the photodetector; adjusting at least one of a position and, or, an orientation of the first laser diode until the monitored measure of the alignment beam which passes through the laser cavity of the first laser diode from the first side to the second side, as detected by the photodetector, if any, at least meets a threshold value; and fixing the first laser diode in the adjusted at least one position and, or, orientation at which the measure of the alignment beam as detected by the photodetector at least meets the threshold value.

The method may further include: positioning the alignment light source in a first position and, or, a first orientation wherein the alignment beam enters the laser cavity on the first side of the first laser diode and exits the laser cavity on the second side of the first laser diode when the first laser diode is initially positioned at the first location; and positioning and orienting the photodetector to detect any portion of the alignment beam that passes through the laser cavity of the first laser diode from the first side to the second side of the first laser diode when the first laser diode is initially positioned at the first location.

The method may further include: positioning the alignment light source in a second position and, or, a second orientation wherein the alignment beam enters the laser cavity on the second side of the first laser diode and exits the laser cavity on the first side of the first laser diode when the first laser diode is initially positioned at the first location; and positioning and orienting the photodetector to detect any portion of the alignment beam that passes through the laser cavity of the first laser diode from the second side to the first side of the first laser diode when the first laser diode is initially positioned at the first location. Further, initially positioning and orienting the first laser diode at the first location includes operating the laser cavity as a passive waveguide.

The method may further include: the alignment light source producing a laser alignment beam separate and distinct from a light source of the first laser diode; performing acts of the method wherein no electrical power is supplied to the first laser diode while acts of the method occur; utilizing a pick and place machine to perform at least one of initially positioning and orienting the first laser diode, and, or, adjusting at least one of the position and, or, the orientation of the first laser diode; and the optical path further including one or more optical lenses, reflectors, and, or, a beam combiner and aiming the alignment beam includes aiming the alignment beam to successfully pass through at least one of the one or more optical lenses, reflectors, and, or, the beam combiner.

The method may further include: repeating acts of the method for a second location at which a second laser diode is to be mounted, adjusting at least one of the position and, or, the orientation of the first laser diode and adjusting at least one of the position and, or, the orientation of the second laser diode includes orienting the laser cavity of the first laser diode and orienting the laser cavity of the second laser diode to produce collinear beams; adjusting at least one of the position and, or, the orientation of the first laser diode until the threshold value is an absolute maximum value; aiming the alignment beam with a first robotic appendage and wherein positioning and orienting the photodetector includes positioning and orienting the photodetector via a second robotic appendage; and aiming the alignment beam and positioning and orienting the photodetector via a first robotic appendage.

A second exemplary implementation of a method of assembly for a device, such as a laser projector, having a body, at least a first location at which a reverse-biased first laser diode is to be mounted, and an optical path that extends through at least a portion of the body may be summarized as including: aiming an alignment beam produced by an alignment light source to pass through the first location at which the first laser diode is to be mounted; initially positioning and orienting the reverse-biased first laser diode at the first location, the reverse-biased first laser diode including a first side, a second side and a laser cavity that provides an optical passage through the reverse-biased first laser diode from the first side to the second side thereof; adjusting at least one of a position, and, or, an orientation of the reverse-biased first laser diode until light from the alignment beam, if any, enters the laser cavity, wherein when light from the alignment beam is in the laser cavity the reverse-biased first laser diode provides a measure; monitoring the measure of the reverse-biased first laser diode until the measure at least meets a threshold value; and fixing the reverse-biased first laser diode in the adjusted at least one position, and, or, orientation at which the measure at least meets the threshold value.

The method may further include: monitoring the measure of the reverse-biased first laser diode until the measure is an absolute minimum value; providing electrical power to the reverse-biased first laser diode while adjusting at least one of the position, and, or, the orientation of the reverse-biased first laser diode; the optical path including one or more optical lenses, reflectors, and, or, a beam combiner and aiming the alignment beam includes aiming the alignment beam to successfully pass through at least one of the one or more optical lenses, reflectors, and, or, the beam combiner; repeating acts of the method at a second location at which a reverse-biased second laser diode is to be mounted; and the alignment light source producing an aggregate alignment beam including at least two of red, green, blue, ultraviolet, and infrared light beams, the beam combiner separating the aggregate alignment beam into separate at least two of red, green, blue, ultraviolet, and infrared light beams.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

Figure 1:
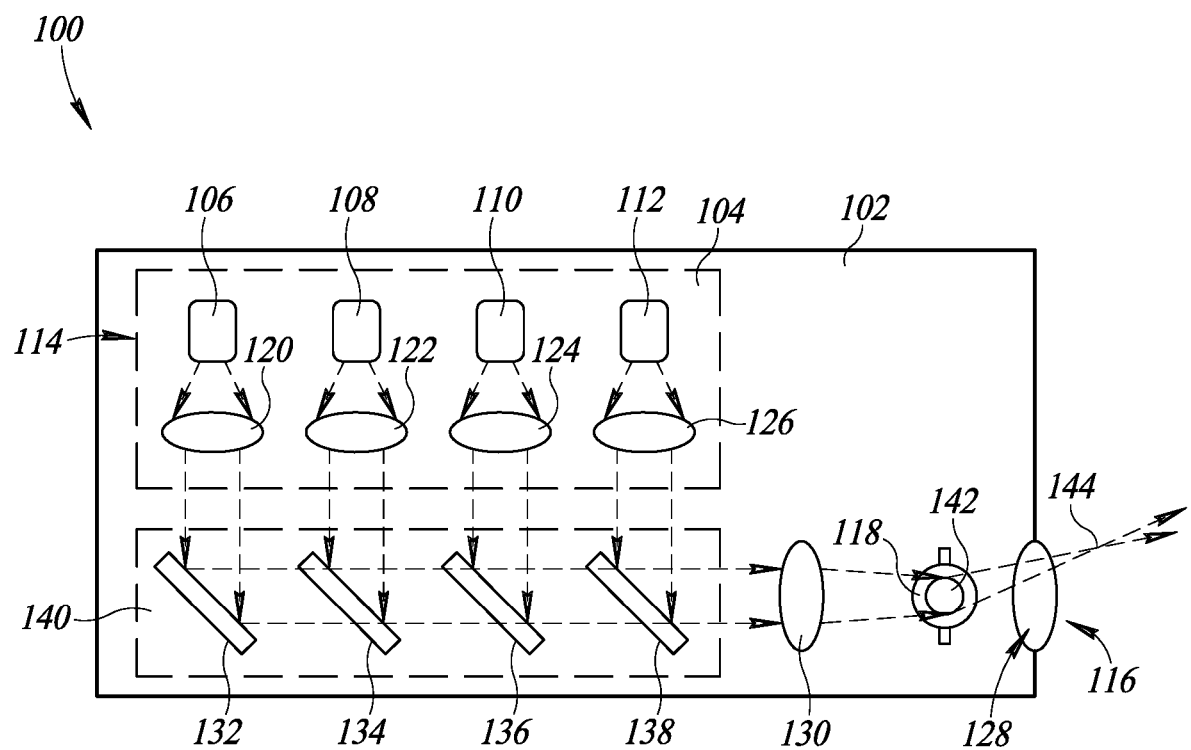
FIG. 1 is a schematic diagram of an exemplary laser projector having a body, one or more laser diodes mounted in the body and an optical path that extends through at least a portion of the body.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

The "spot size" of a laser beam refers to the cross sectional area of the laser beam at any point along the length of the beam. It is generally desirable for the laser beam in a laser projector to impinge on the at least one controllable mirror with a spot size that is less than or equal to the area of the controllable mirror itself (or the total area of the array of mirrors in the case of a DLP). If the spot size of the laser beam at the at least one controllable mirror is larger than the area of the mirror itself then portions of the laser "spot" that extend over the perimeter of the mirror may not be redirected by the mirror and may be cropped from the optical path of the projector. In this way, the area of the at least one controllable mirror effectively serves as an aperture in the optical path of the laser light—only laser light that impinges on the mirror follows the projection path to become a deliberate part of the projected image. Unwanted cropping of the laser beam at the at least one controllable mirror is inefficient and can adversely affect the quality of the projected image by, for example, reducing the brightness, intensity, and/or color saturation of the projected image relative to what can be achieved if the entire laser spot fits on the area of the at least one controllable mirror.

In a conventional laser projector comprising a RGB laser module with a red laser diode, a green laser diode, and a blue laser diode, each respective laser diode has a corresponding respective focusing lens. The relative positions of the laser diodes, the focusing lenses, and the at least one controllable mirror are all tuned and aligned so that each laser beam impinges on the at least one controllable mirror with substantially the same spot size and with substantially the same rate of convergence (so that all laser beams will continue to have substantially the same spot size as they propagate away from the laser projector towards, e.g., a projection screen). In a conventional laser projector, it is usually possible to come up with such a configuration for all these elements because the overall form factor of the device is not a primary design consideration. However, in applications for which the form factor of the laser projector is an important design element, it can be very challenging to find a configuration for the laser diodes, the focusing lenses, and the at least one controllable mirror that sufficiently aligns the laser beams (at least in terms of spot size, spot position, and rate of convergence) while satisfying the form factor constraints.

The present disclosure generally relates to a method of assembling a device, such as a projector or a laser projector, and more particularly to aligning laser diodes during assembly of a laser projector that uses laser diodes as a laser light source, wherein during alignment of the laser diodes, electrical power is not required to be provided to the laser diodes. Alternatively, where electrical power is required, embodiments of the present disclosure provide for methods of simplifying the alignment process of the laser diodes, thereby increasing efficiency and reliability of the assembly process. Such alignment methods are useful for alignment of a light source in projectors generally, but may be particularly useful in aligning a light source in a projector with a small form factor. An example of such an application is in scanning laser-based wearable heads-up displays ("WHUDs").

Generally, a scanning laser-based WHUD is a form of virtual retinal display in which a scanning laser projector ("SLP") draws a raster scan onto the eye of the user. The SLP may project laser light directly onto/into the eye of the user or laser light from the SLP may be routed towards the eye of the user by one or more optical element(s) in the optical path of the laser light en route from the SLP to the eye of the user. Exemplary architectures for SLP-based WHUDs that may be used in conjunction with (e.g., that may benefit from implementing) the present systems, devices, and methods include without limitation the WHUD architecture(s) described in: US Patent Application Publication No. US 2015-0378161 A1, U.S. Non-Provisional patent application Ser. No. 15/046,234, U.S. Non-Provisional patent application Ser. No. 15/046,254, U.S. Non-Provisional patent application Ser. No. 15/046,269, U.S. Provisional Patent Application Ser. No. 62/156,736, U.S. Non-Provisional patent application Ser. No. 15/145,576, US Patent Application Publication No. US 2016-0327797 A1, and/or US Patent Application Publication No. US 2016-0327796 A1.

FIG. 1 shows an exemplary projector 100, which in an embodiment, is a laser projector. The projector 100 includes a body 102 with a laser module 104 mounted in the body 102. The laser module 104 further includes: a first laser diode 106, a second laser diode 108, a third laser diode 110, and a fourth laser diode 112 (e.g., a red laser diode 106, a green laser diode 108, a blue laser diode 110, and an infrared laser diode 112). Each laser diode is operative to provide diverging laser light (i.e., laser light having a divergence). In other words, the body 102 further includes one or more diodes 106, 108, 110, 112 mounted in the body 102. In the illustration of laser projector 100 in FIG. 1, diverging laser light from each diode is represented by pairs of dashed arrows, where the area including and in between each pair of dashed arrows corresponds to a respective laser beam. As illustrated and described in more detail below, each laser beam, as represented by pairs of dashed arrows, propagates along an optical path that extends through at least a portion of the body 102, or more particularly, from an input end 114 of the projector 100 proximate the diodes through a portion of the body 102 to an output end 116 of the projector 100 proximate a first scan mirror 118.

Laser projector 100 includes the laser module 104 to provide laser light, where laser module 104 includes at least a first laser diode 106 to provide a first laser light such that the laser light provided by the laser module includes at least the first laser light. As previously described, first laser diode 106 may be a red laser diode, though in practice first laser diode 106 may be any variety of laser diodes operative to produce laser light having any wavelength (e.g., green, blue, infrared, ultraviolet, or somewhere in between).

The first laser light provided by first laser diode 106 may generally exhibit, be imbued with, or "have" a divergence (at least at a certain distance from the first laser diode) that causes the spot size of the first laser light to expand as distance from first laser diode 106 increases. In order to keep this expansion in check so that all of the first laser light remains in the projection path without unduly large optical components, laser module 106 also includes a first collimation lens 120 positioned in the optical path of the first laser light. First collimation lens 120 receives the first laser light from first laser diode 106 and at least reduces a divergence of the first laser light. In some implementations, first collimation lens 120 may substantially collimate the first laser light; however, in other implementations the first laser light coming out of first collimation lens 120 may still have some divergence (though less divergence than the first laser light going into first collimation lens 120) or the first laser light coming out of first collimation lens 120 may have some convergence. Throughout this specification and the appended claims, the term "collimation" is used loosely in "collimation lens" to refer to a lens that at least reduces the divergence of light passing therethrough and may or may not cause the light to actually be collimated. As used herein, "substantially collimate" generally means to collimate within +/−10%.

In certain implementations, the first collimation lens 120 is replaced with a first focusing lens (not shown). One of skill in the art will appreciate that in implementations using a first focusing lens, the first focusing lens receives diverging laser light from first laser diode 106 and converges or focuses that laser light, whereas first collimation lens 120 in projector 100 receives diverging first laser light from first laser diode 106 and reduces the divergence of that first laser light. The first focusing lens (not shown) focuses the laser light by initiating the rate of convergence that propagates right through and out of an aperture 128 at the output end 116 of projector 100, whereas first collimation lens 120 in projector 100 reduces the divergence of the first laser light (e.g., substantially collimates the first laser light) so that the first laser light propagates through projector 100 with a relatively compact spot size, but first collimation lens 120 does not necessarily focus the first laser light or initiate the rate of convergence that will propagate out through the aperture 128 of projector 100. In order to focus/converge the first laser light, the optical path of the first laser light in projector 100 includes a second lens namely, convergence lens 130.

Convergence lens 130 is positioned downstream from laser module 104 in an optical path of the laser light provided by laser module 104. Since the laser light provided by laser module 104 includes the first laser light provided by first laser diode 106, convergence lens 130 is positioned in the optical path of the first laser light downstream from first collimation lens 120. Convergence lens 130 receives the laser light from laser module 104 (including the first laser light from first laser diode 106) and converges the laser light to a focus 144 that may be outside of projector 100.

In the illustrated example of projector 100 in FIG. 1, laser module 104 further includes: a second laser diode 108 (e.g., a green laser diode) to provide a second laser light with a second collimation lens 122 positioned in the optical path of the second laser light to at least reduce the divergence of the second laser light; a third laser diode 110 (e.g., a blue laser diode) to provide a third laser light with a third collimation lens 124 positioned in the optical path of the third laser light to at least reduce the divergence of the third laser light; and a fourth laser diode 112 (e.g., an infrared laser diode) to provide a fourth laser light with a fourth collimation lens 126 positioned in the optical path of the fourth laser light to at least reduce the divergence of the fourth laser light. The second laser light, the third laser light, and the fourth laser light are all included (along with the first laser light) in the laser light output by laser module 104.

In accordance with the present systems, devices, and methods, because collimation lenses 120, 122, 124, 216 only reduce the divergence of the laser light provided by laser diodes 106, 108, 110, 112 rather than actually focusing and initiating the "output" rate of convergence (output by the projector as a whole) of the laser light (as is done in implementations utilizing a respective focusing lens (not shown) for each diode 106, 108, 110, 112), collimation lenses 120, 122, 124, 126 do not necessarily each need to accommodate a different spot size of laser light from the corresponding laser diode 106, 108, 110, 112 and, accordingly, collimation lenses 120, 122, 124, 126 may each be substantially the same size as one another. The uniform, compact size of collimation lenses 120, 122, 124, and 126 in projector 100 is a contributing factor in realizing a compact form factor of projector 100, such that the projector 100 is suitable for use in a variety of different applications, including wearable heads-up displays. Furthermore, because each of collimation lenses 120, 122, 124, and 126 is substantially the same size, each of collimation lenses 120, 122, 124, and 126 is positioned to receive substantially the same spot size of laser light from the corresponding laser diodes 106, 108, 110, and 112 and, accordingly, collimation lenses 120, 122, 124, and 126 are generally positioned closer to the outputs of laser diodes 106, 108, 110, and 112 on average, in projector 100 as compared to the positions of one or more focusing lenses (not shown) in alternative projector embodiments.

Projector 100 also includes a combiner 140 comprising four reflectors 132, 134, 136 and 138. The four reflectors 132, 134, 136 and 138 in combiner 140 of projector 100 are positioned and oriented to combine the respective laser light from laser diodes 106, 108, 110 and 112 into a single aggregate laser beam (i.e., the "laser light" output by projector 100); however, because the laser lights impingent on reflectors 132, 134, 136 and 138 in projector 100 are not converging as they are on reflectors in a projector with focusing lenses, reflectors 132, 134, 136 and 138 are all substantially the same size as one another. The uniform, compact size of reflectors 132, 134, 136 and 138 in projector 100 is another contributing factor in realizing the compact form factor of projector 100 compared to the form factor of other projectors. In one implementation, reflectors 132, 134, 136 and 138 include reflective and/or dichroic material to selectively reflect and/or transmit the various wavelengths of laser light provided by laser diodes 106, 108, 110 and 112.

Projector 100 includes at least the first scan mirror 118 positioned in the optical path of the laser light (i.e., the aggregate laser light) at the output of combiner 140. First scan mirror 118 includes a two dimensional reflective area (e.g., a square or rectangular surface having a length and a width or a circular surface having a diameter) and a spot size 142 of the laser light at first scan mirror 118 is less than or about equal to the reflective area of first scan mirror 118. In some implementations, the reflective area of first scan mirror 118 may be controllably rotatable about a first axis and a dimension of the spot size 142 (e.g., a dimension of the spot) of the laser light at the reflective area of first scan mirror 118 may be less than or about equal to a dimension of the reflective area of first scan mirror 118 along the first axis. Such implementations may further include a second scan mirror (not illustrated in FIG. 1 for the sake of simplicity) positioned in the optical path of the laser light in between first scan mirror 118 and the focus 144 of the laser light. The second scan mirror may include a two dimensional reflective area, where the reflective area of the second scan mirror is controllably rotatable about a second axis that is orthogonal to the first axis of the reflective area of first scan mirror 118. In this configuration, the spot size (e.g., a dimension of the spot size or a dimension of the spot) of the laser light at the reflective area of the second scan mirror may be less than or about equal to a dimension of the reflective area of the second scan mirror along the second axis.

In the illustrated example of projector 100, diverging laser light provided by laser diodes 106, 108, 110 and 112 is substantially collimated by collimation lenses 120, 122, 124, and 126, respectively, and remains collimated when reflected and combined into a single aggregate laser beam by reflectors 132, 134, 136 and 138 of combiner 140. In accordance with the present systems, devices, and methods, this approach allows for more compact optical components with more compact spacing therebetween, which contributes to a more compact overall form factor in projector 100. In order to focus the laser light (i.e., the aggregate laser light) down to a spot size 142 that is less than or equal to the size of the at least one scan mirror 118 at the position of the mirror 118, projector 100 includes a dedicated convergence lens 130 in the optical path of the aggregate laser light in between combiner 140 and the at least one scan mirror 118. Since the laser light from each of laser diodes 106, 108, 110, and 112 are all substantially collimated and with substantially the same spot size when incident on convergence lens 130, single convergence lens 130 applies substantially the same rate of convergence to each ray or beam of the laser light from respective ones of laser diodes 106, 108, 110, and 112 such that each ray or beam of the laser light maintains substantially the same spot size as the other rays or beams of laser light at all points along the optical paths thereof as they converge to focus 144 and diverge therefrom.

Focus 144 is a common focal point of each ray or beam of the laser light emitted by respective laser diodes 106, 108, 110, and 112. In other words, focus 144 is a focal point of the aggregate laser light output by projector 100, the position of which is determined by the rate of convergence applied to the aggregate laser light by convergence lens 130. Generally, in laser projection applications it is advantageous for the position of focus 144 to be outside of the projector as illustrated in FIG. 1. Furthermore, as the laser light emitted by laser diodes 106, 108, 110, and 112 may generally be Gaussian beams, the spot size at focus 144 may not reach zero but may rather converge to a non-zero beam waist. That is, the laser light may converge to a focus having a diameter that is greater than zero, such as a diameter on the order of micrometers or millimeters. The non-zero beam waist of the aggregate laser light at focus 144 may correspond to the minimum spot size of the aggregate laser light along the optical path thereof; thus, spot size 142 of the laser light at scan mirror 118 is larger than the spot size (e.g., minimum beam waist) of the laser light at focus 144.

In various alternative implementations, a laser projector employing a single dedicated convergence lens to focus the laser light from multiple laser diodes may include any number N of laser diodes (i.e., where N≥1) arranged in any configuration and having any combination of wavelengths. Because the laser projectors described herein that employ a single convergence lens also may include a set of collimation lenses (i.e., to at least reduce the divergence of laser light output by the laser diodes), and the collimation lenses are upstream from the convergence lens in the optical paths of the laser light, the collimation lenses may generally be referred to herein as "primary lenses" and the convergence lens may generally be referred to herein as a "secondary lens."

Figure 2A:
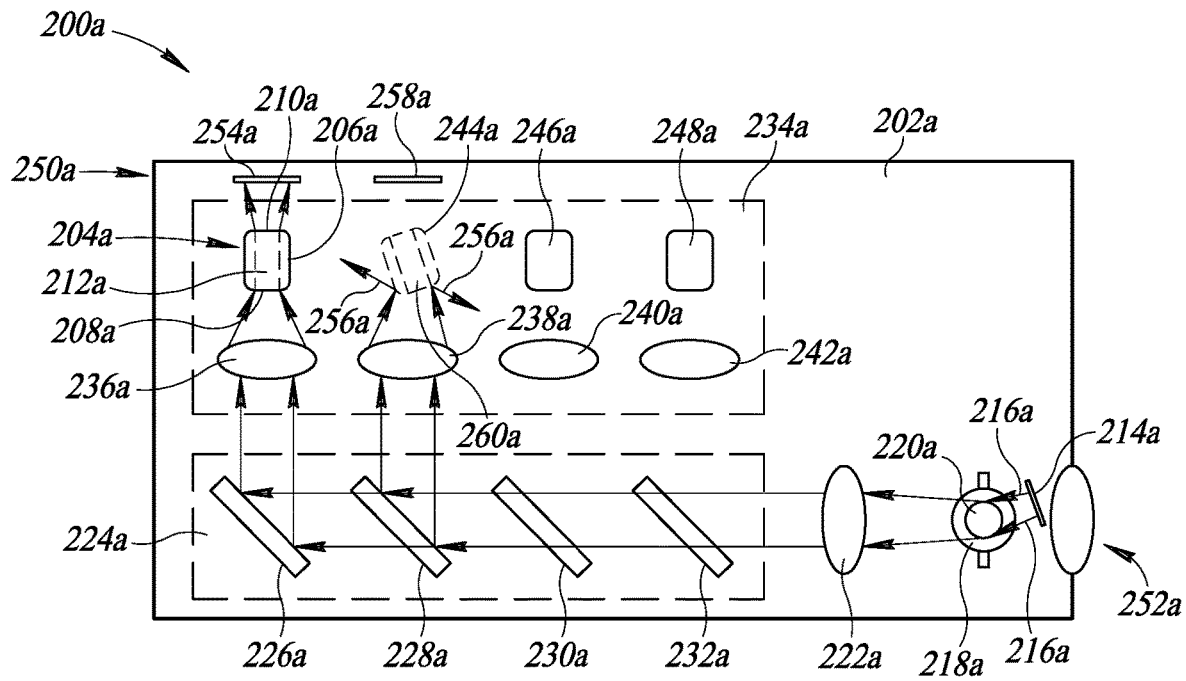
FIG. 2A is a schematic diagram of an exemplary laser projector having a body, at least a first location at which a first laser diode is to be mounted, an optical path that extends through at least a portion of the body, and an alignment beam positioned proximate an output end of the laser projector and a photodetector positioned proximate an input end of the laser projector.

FIG. 2A shows a projector 200a during assembly of the projector 200a. One of skill in the art will appreciate that the projector 200a can include identical features to the projector 100 (FIG. 1) when the projector 200a is in an operational or constructed configuration. Alternatively, the projector 200a can include only some of the features of the projector 100 (FIG. 1). For example, in an implementation, the projector 200a includes only one laser diode and a single respective collimating lens and reflector, whereas the projector 100 (FIG. 1) may include more than one laser diode and more than one collimating lens and reflector associated with the more than one laser diode.

The projector 200a includes a body 202a with a first location 204a at which a first laser diode 206a is to be mounted. In this illustrated implementation, the first location 204a is proximate an input portion 250a of the projector 200a. The projector 200a includes an optical path that extends through at least a portion of the body 202a, as described above with reference to projector 100 (FIG. 1) and beams of light propagating from the laser diodes 106, 108, 110, and 112 (FIG. 1) through the projector 100 (FIG. 1) to the aperture 128 (FIG. 1), or more particularly, the optical path extends at least from the input portion 250a to an output portion 252a of the projector 200a, as described herein. In the illustrated implementation, the first laser diode 206a is aligned at the first location 204a such that the first diode 206a is in a position and, or, an orientation to be fixed or mounted to the body 202a. The first laser diode 206a includes a first side 208a and a second side 210a. In an aspect, the first side 206a is opposite the second side 210a. A laser cavity 212a extends through the first laser diode 206a from the first side 208a to the second side 210a to provide an optical passage through the first laser diode 206a from the first side 208a to the second side 210a.

An alignment light source 214a is temporarily positioned and oriented in the optical path of the projector 200a during assembly of the projector 200a. In the illustrated implementation, the alignment light source 214a is positioned and oriented inside the body 202a of the projector 200a while in other implementations, the alignment light source 214a is positioned outside the body 202a of the projector 200a. The alignment light source 214a is operable to produce an alignment beam, represented in FIG. 2A by solid arrows 216a propagating from alignment light source 214a. In certain implementations, the alignment light source 214a is a laser light source, such as a red, green, blue, infrared, ultraviolet, or aggregate (i.e., comprising two or more of red, green blue, infrared, or ultraviolet laser light) laser light source. As illustrated in FIG. 2A, the alignment beam, as represented by arrows 216a is aligned with the optical path such that the alignment beam passes through the first location 204a. In other words, the optical path extends through the body 202a of the projector 200a in a first direction as indicated by dashed arrows in FIG. 1. The alignment beam of this implementation propagates along the optical path in a second direction that is opposite the first direction.

The projector 200a further includes a first scan mirror 218a positioned in the optical path of projector that includes a two-dimensional reflective area with a spot size 220a of the alignment beam at the first scan mirror 218a being less than or about equal to the reflective area of first scan mirror 218a. In some implementations, the reflective area of first scan mirror 218a may be controllably rotatable about a first axis and dimension of the spot size 220a may be less than or about equal to the a dimension of the reflective area of first scan mirror 218a along the first axis. Similar to projector 100 (FIG. 1), the projector 200a also includes a combiner 224a comprising four reflectors 226a, 228a, 230a, and 232a. The four reflectors 226a, 228a, 230a, and 232a in combiner 224a are positioned and oriented to separate light from alignment light source 214a into respective beams of light. In an implementation, the alignment beam from alignment light source 214a is an aggregate beam including red, green, blue and infrared laser light wherein each reflector 226a, 228a, 230a, and 232a include dichroic material to selectively reflect and/or transmit the various wavelengths of laser light provided by the alignment light source 214a. Alternatively, certain implementations include the alignment beam light source producing the alignment beam with a wavelength corresponding to only red, green, blue, infrared, or ultraviolet laser light.

In an implementation where the alignment light source 214a produces an aggregate laser alignment beam, dichroic material on each reflector 226a, 228a, 230a, and 232a may selectively separate the aggregate beam into respective individual beams. For example, in an implementation, reflector 226a includes a dichroic material that only reflects light having a wavelength in the red spectrum (e.g., light with a wavelength between about 620-750 nanometers ("nm")), or in other words, only reflects the portion of the aggregate beam that corresponds to red laser light. Similarly, the second reflector 228a includes a dichroic material for reflecting only green light (e.g., light with a wavelength between about 495 to 570 nm), third reflector 230a includes a dichroic material for reflecting only blue light (e.g., light with a wavelength between about 450 to 495 nm) and fourth reflector 232a includes a dichroic material to selectively reflect only infrared light (e.g. light with a wavelength between about 750 nm to 1 millimeter). As such, when an aggregate laser light beam propagates through the combiner 224a and each reflector 226a, 228a, 230a, and 232a, the aggregate beam is separated into respective red, green, blue, and infrared laser light beams. Alternatively, in implementations where the alignment light source 214a produces only one of red, green, blue, ultraviolet or infrared laser light, each of the reflectors 226a, 228a, 230a, and 232a may still include the dichroic material, with each reflector 226a, 228a, 230a, and 232a operative to selectively align one of the diodes 206a, 244a, 246a, and 248a. Further, one of skill in the art will appreciate that the present disclosure may be applied to projector systems with only one laser diode, wherein the singular laser diode is of any type discussed herein.

The projector 200a also includes a laser module 234a, which includes the first diode 206a and the first location 204a at which the first diode 206a is to be mounted. The laser module 234a further includes a first collimation lens 236a in the optical path of the first laser diode 206a when the first laser diode 206a is positioned and oriented in an operational configuration, as shown in FIG. 2A. The first collimation lens 236a is substantially similar to first collimation lens 120 in FIG. 1. The projector 200a further includes a convergence lens 222a positioned downstream in the optical path from the combiner 224a and upstream from the first scan mirror 218a substantially similar to convergence lens 130 in FIG. 1. In an implementation, the laser module 234a also includes second collimation lens 238a, third collimation lens 240a, and fourth collimation lens 242a as well as second laser diode 244a, third laser diode 246a and fourth laser diode 248a. As shown in FIG. 2A, each laser diode 206a, 244a, 246a, and 248a corresponds to a respective one of the collimation lenses 246a, 238a, 240a, and 242a in the laser module 234a.

As such, when assembling the projector 200a, the alignment light source 214a is positioned and oriented proximate the output portion 252a of projector 200a. In other words, the alignment light source 214a is positioned and oriented in the optical path represented by the dashed arrows in FIG. 1 at a location that is proximate the output portion 252a and more particularly, proximate the first scan mirror 218a and preferably downstream along the optical path from first scan mirror 218a. The alignment light source is operated so as to produce the alignment beam, as represented by solid arrows 216a. In an implementation, the alignment light source 214a produces the alignment beam that is one of red, blue, green, ultraviolet, or infrared laser light. Alternatively, in other implementations, the alignment light source 214a produces an aggregate alignment beam including two or more of red, blue, green, ultraviolet, or infrared laser light. In further aspects, the alignment light source 214a is one of one of a fiber optic illuminator, a helium neon laser, a quartz tungsten halogen source, a solar simulator, an arc lamp, or a deuterium light source.

The alignment beam diverges from the alignment light source 214a to form the spot size 220a on the reflective surface of the first scan mirror 218a. The first scan mirror 218a reflects the alignment beam through the convergence lens 222a and into the combiner 224a, which includes each of the reflectors 226a, 228a, 230a, and 232a. In the illustrated implementation, light from the alignment beam reflects from first reflector 226a to first collimation lens 236a. When the first laser diode 206a is positioned in the first location 204a, the alignment beam impinges on the first side 208a of the first laser diode 206a. When the first laser diode 206a is positioned and oriented in an operating configuration, as shown, the alignment beam passes through the laser cavity 212a from the first side 208a to the second side 210a, wherein the alignment beam exits the second side 210. Then, the alignment beam hits a photodetector 254a. The photodetector 254a is positioned upstream from first laser diode 206a and proximate the first location 204a and the input portion 250a of the projector 200a. When light impinges upon the photodetector 254a, the photodetector 254a registers a measure corresponding to the amount of light impinging upon the photodetector 254a. In an implementation, the measure is a signal, wherein the signal increases in value as more light from the alignment beam impinges upon the photodetector 254a. Accordingly, the measure can include a range of values from a minimum amount of the alignment beam impinging upon the photodetector 254a to the maximum amount of the alignment beam impinging upon the photodetector 254a.

Preferably, the first laser diode 206a is then fixed in place at the first location 204a in a position and, or, an orientation where the photodetector 254a registers at least a minimum threshold value of the measure, or, alternatively, the first laser diode 206a is fixed in place at the first location 204a when at least a portion of the alignment beam impinges upon the photodetector 254a. More preferably, the first laser diode 206a is fixed in place at a position and, or, an orientation that corresponds to the photodetector 254a registering an absolute maximum value of the measure, or when an entirety of the alignment beam impinges upon the photodetector 254a. As such, in the illustrated implementation, the first laser diode 206a acts as a passive waveguide, wherein the laser cavity 212a restricts expansion of the alignment beam in at least one dimension and more preferably in two dimensions. In an aspect where the first laser diode 206a acts as a passive waveguide, the wavelength of the alignment beam from the alignment light source 214a is longer than the diode emission wavelength from the first laser diode 206a.

Thus, because the alignment beam passes through the optical path in a second direction that is opposite a first direction of the optical path as indicated by the dashed arrows in FIG. 1, when light from the alignment beam passes through the laser cavity 212a of the first laser diode 206a to register the measure at the photodetector 254a, the first laser diode 206a is in the operating configuration, or is aligned with the optical path such that light from the first laser diode 206a will propagate through the optical path. Further, because the first laser diode 206a acts as a passive waveguide, electrical power to the first laser diode 206a during alignment is not required, which reduces the complexity of the alignment process and thus allows for more efficient and precise alignment of the first laser diode 206a.

One of skill in the art will understand that if one of the laser diodes 206a, 244a, 246a, and 248a is positioned or oriented at a location, such as the first location 204a, wherein the respective laser diode is to be mounted in the body 202a, but is positioned and oriented in such a way that light from the alignment light source 214a is not able to pass through the laser cavity of the respective diode, then light from the alignment light source 214a and, or, the alignment beam will not register the measure at the photodetector 254a. For example, in FIG. 2A, second laser diode 244a is represented by dashed lines with light from the alignment beam passing through the second collimation lens 238a to impinge upon the second laser diode 244a. Because a laser cavity 260a of the second laser diode 244a is not aligned with the optical path, light from the alignment beam will not enter the laser cavity 260a of the second laser diode 244a and thus will not pass through second laser diode 244a to register a measure at the photodetector 258a.

In other words, light from the alignment beam will reflect off of second laser diode 244a as indicated by arrows 256a and will not pass through the laser cavity 260a of the second laser diode 244a to impinge upon the photodetector 258a. In this situation, the second laser diode 244a is not in an operational configuration, as light from the second laser diode 244a will not exit the laser cavity 260a and travel along the optical path once power is provided to the second laser diode 244a. Accordingly, a position and, or, an orientation of the second laser diode 244a is preferably adjusted until light from the alignment light source 214a and, or, the alignment beam passes through the laser cavity 260a of second laser diode 244a. Accordingly, one of skill in the art will appreciate that each of the second, third and fourth laser diodes 244a, 246a, and 248a can be aligned in in a similar manner to first laser diode 206a.

In this implementation, the alignment light source 214a may be temporarily fixed in place for alignment of each of the diodes 206a, 244a, 246a, and 248a because adjustment of the alignment light source 214a during alignment of the diodes is not necessarily required. The photodetector 254a is preferably positioned and, or, oriented in the optical path proximate locations where each of the diodes are to be mounted, such as the first location 204a. Accordingly, more than one photodetector 254a may be used, for example, one photodetector for each diode being aligned (i.e., a first, second, third and fourth photodetector) or the same photodetector 254a may be used, with the position and, or, orientation of the photodetector 254a adjusted between each alignment location or adjusted for alignment of each respective diode.

In an implementation, the first laser diode 206a is reverse-biased. As such, the reverse-biased first laser diode 206a acts as a photodetector itself. One of skill in the art will appreciate that in this case, when the alignment of the first laser diode 206a enables it to receive a reverse-propagating alignment beam, such as when the first laser diode 206a is positioned and, or, oriented at the first location 204a as in FIG. 2A and the alignment beam propagates through the optical path in a direction that is opposite the direction that light from the first laser diode 206a propagates during operation of the projector 200a, the first laser diode 206a will provide a measure when the alignment beam is in the laser cavity 212a. In order to provide the measure, electrical power is provided to the laser diode 206a during alignment.

The value of the measure can be monitored until the measure at least meets a threshold value. Then, the first laser diode 206a can be fixed in place when the measure, which may be a signal, at least meets the threshold value. Alternatively, the first laser diode 206a can be fixed in place at a position and, or, an orientation that corresponds to the measure being an absolute maximum or minimum value (i.e., if the reverse-biasing results in a negative-value detection measure or signal), or a position and, or, an orientation that corresponds to a maximum magnitude of a signal that constitutes the measure. Accordingly, in such an aspect, the photodetector 254a is not required, which simplifies the alignment process. Further, one of skill in the art will understand that the alignment process using the first laser diode 206a as a reversed-biased laser diode can be repeated at a second location for the second laser diode 244a, as well as at a third and fourth location at which the third and fourth laser diodes 246a, 248a are to be mounted, as described herein. Further, implementations using the reverse-biased first laser diode 206a can include the projector 200a having other features described herein, such as a combiner 224a that separates an aggregate alignment beam into its constitute parts (i.e., the combiner 224a separates an aggregate light beam into separate two or more of red, green, blue, ultraviolet, and infrared light beams).

Figure 2B:
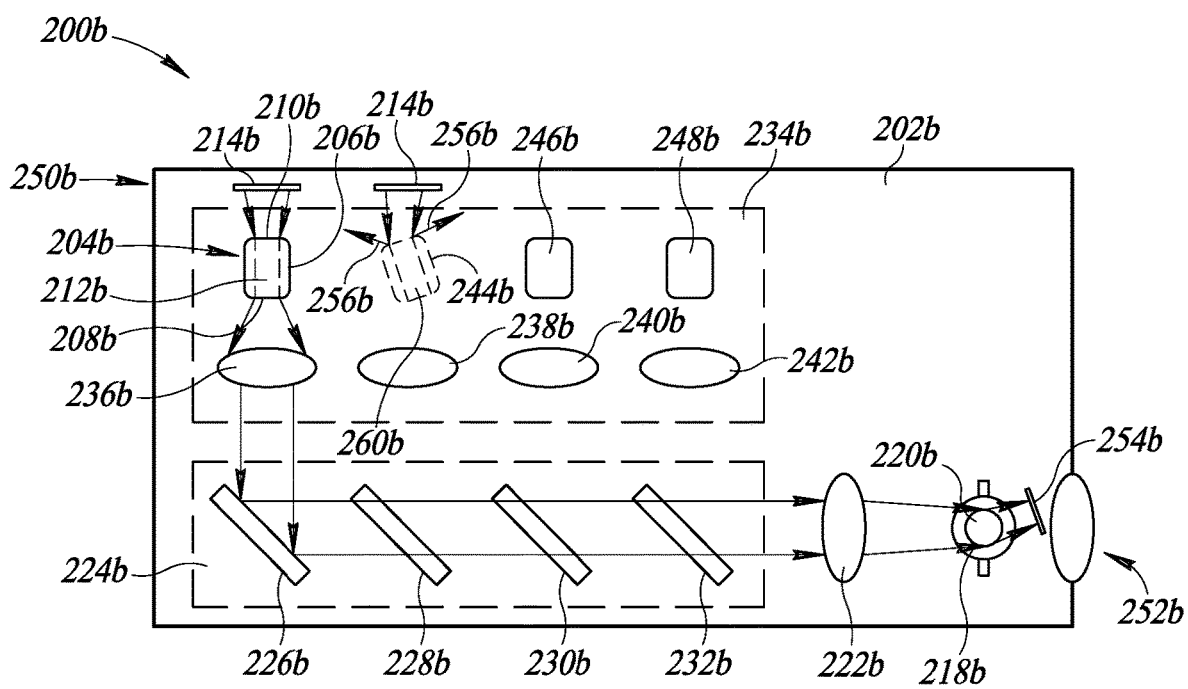
FIG. 2B is a schematic diagram an exemplary laser projector having a body, at least a first location at which a first laser diode is to be mounted, an optical path that extends through at least a portion of the body, and an alignment beam positioned proximate an input end of the laser projector and a photodetector positioned proximate an output end of the laser projector.

FIG. 2B shows a projector 200b during assembly of the projector 200b wherein projector 200b is similar in several aspects to projector 200a in FIG. 2A. For example, projector 200b includes a body 202b with a laser module 234b and a combiner 224b and an optical path extending through at least a portion of the body, similar to the optical path described above with reference to FIG. 1. The laser module 234b includes at least a first location 204b wherein at least a first laser diode 206b is to be mounted. In an implementation, the laser module 234b includes a second laser diode 244b, a third laser diode 246b, and a fourth laser diode 248b. For each laser diode, the laser module 234b further includes a collimation lens, such as first collimation lens 236b, second collimation lens 238b, third collimation lens 240b, and fourth collimation lens 242b. The combiner 224b includes reflectors 226b, 228b, 230b, and 232b. The projector 200b also includes a convergence lens 222b downstream along the optical path from the combiner 224b as well as a first scan mirror 218b downstream from the convergence lens 222b and a spot size 220b of light from alignment light source 214b. A photodetector 254b is positioned and, or, oriented in the optical path downstream from the first scan mirror 218b and proximate an output portion 252b of projector 200b.

As such, during assembly of projector 200b, the body 202b is provided with certain aspects of the optical path in place. For example, prior to placement of any diodes, the body 202b is provided with the laser module 234b, including each of the collimation lenses 236b, 238b, 240b, and 242b in place in the optical path along with the combiner 224b and each of the reflectors 226b, 228b, 230b, and 232b. The convergence lens 222b is downstream in the optical path from the combiner 224b and the first scan mirror 218b is downstream in the optical path from the convergence lens 222b. With these elements in place, the alignment light source 214b is positioned and, or, oriented proximate the first location 204b at which the first laser diode 206b is to be mounted. In the illustrated implementation, the alignment light source is positioned and, or, oriented upstream in the optical path from the first location 204b proximate an input portion 250b of the projector 200b. The alignment light source 214b is operated such that an alignment beam produced by the alignment light source 214b passes through the first location 204b at which the first laser diode 206b is to be mounted. The first laser diode 206b is initially positioned and, or, oriented at the first location 204b.

Then, the position and, or, orientation of the first laser diode 206b at the first location 204b is adjusted until the alignment beam from the alignment light source 214b enters a laser cavity 212b of the first laser diode 206b from a second side 210b and passes through the laser cavity 212b from the second side 210b to a first side 208b of the first laser diode 206b. As such, similar to the first laser diode 206a in FIG. 2A, the first laser diode 206b acts as a passive waveguide during alignment of the first laser diode 206b. More particularly, the laser cavity 212b of the first laser diode 206b acts as a passive waveguide by restricting light from the alignment beam in at least one dimension as it travels through the first laser diode 206b. Once the first laser diode 206b is in a position and, or, an orientation at the first location 204a wherein at least a portion of the alignment beam from alignment light source 214b passes through the laser cavity 212b from the second side 210b of the first laser diode 206b to the first side 208b of the first laser diode 206b, the portion of the alignment beam that exits the first side propagates through the optical path to impinge upon the photodetector 254b. Accordingly, in an implementation, the alignment beam passes through the first location 204b and the laser cavity 212b of the first laser diode 206b, then through first collimation lens 236b wherein after the first collimation lens 236b, the alignment beam is reflected off of reflector 226b. The alignment beam then passes from reflector 226b to the convergence lens 222b before forming a spot size 220b on first scan mirror 218b. The reflective surface of first scan mirror 218b reflects the alignment beam, as represented by the spot size 220b, onto the photodetector 254b which is preferably positioned in the optical path proximate the output portion 252b and downstream along the optical path from the first scan mirror 218b.

One of skill in the art will appreciate that similar to projector 200a in FIG. 2A, this process of aligning the first laser diode 206b can be repeated for second, third, and fourth laser diodes 244b, 246b, and 248b in laser module 234b. For example, when initially positioning and, or, orienting the second laser diode 244b at a second location where the second laser diode 244b is to be mounted in the laser module 234b of the body 202b of the projector 200b, if the initial position of the second laser diode 244b does not allow any light from alignment light source 214b (now positioned proximate the second location where the second laser diode 244b is to be mounted) to pass through a laser cavity 260b of the second laser diode 244b, light from the alignment beam will reflect off of the second laser diode 244b, as represented by arrows 256b. Accordingly, the position and, or, orientation of the second laser diode 244b is adjusted or altered until light from the alignment beam passes through the laser cavity 260b of the second laser diode 244b.

Further, similar to the disclosure above regarding FIG. 2A, when light from the alignment beam produced by the alignment light source 214b passes through the first laser diode 206b, such as is indicated by solid arrows in the illustrated implementation, the light will pass through the optical path as described above and register a measure at the photodetector. Preferably, the first laser diode 206b is fixed in place at the first location 204b wherein the photodetector at least registers a threshold value of the measure. In an implementation, the measure is a signal that is proportional to the amount of light received by a surface of the photodetector 254b. Accordingly, when more light is received by the photodetector 254b, the value of the measure, or signal, will increase. When no light is received or detected by the photodetector 254b, the value of the measure, or signal, is equal to zero. As such, in an aspect, the first laser diode 206b is fixed in place at the first location when the measure provided by the photodetector 254b corresponds to a maximum value, or the threshold value is a maximum value. One of skill in the art will appreciate that the first laser diode 206b is considered to be in an operational configuration when the photodetector 254b at least provides the minimum threshold value of the signal, as light from the first laser diode 206b when electrical power is provided to the first laser diode 206b will leave the laser cavity 212b and travel along the intended optical path.

With reference to FIGS. 1-2B, one of skill in the art will understand that aligning the one or more laser diodes (such as laser diode 106, 206a, or 206b) can also include aligning the one or more laser diodes with respect to certain targets along the optical path, wherein the targets correspond to the intended location, position, and, or orientation of components that are to be added later in the assembly process. By way of example using FIG. 2B, in an implementation, projector 200b is provided with the body 202b and the first location 204b at which the first laser diode 206b is to be mounted. Although FIG. 2B illustrates the projector 200b with components of the optical path already in place or optical components positioned and, or, oriented in an assembled, operational configuration in the optical path, one of skill in the art will appreciate that the body 202b can be provided at various stages of assembly with some, or none, of the components illustrated in FIG. 2B in place or in an operational configuration at the time of aligning the first laser diode 206b at the first location 204b. In this implementation, the optical path is predetermined from a computer model, prior assembly data, or from other sources. In other words, the desired location, position, and, or, orientation of the optical components in the body 202b (such as the first collimation lens 236b, the laser module 234b, the combiner 224b, the first reflector 226b, convergence lens 222b, and first scan mirror 218b in FIG. 2B) are known or are predetermined, even if such components have not been assembled at the time of aligning the first laser diode 206b.

Accordingly, in an aspect, the body 202b is provided with only the first location 204b at which the first laser diode 206b is to be mounted. In this aspect, the photodetector 254b and the alignment light source 214b are positioned and, or, oriented in the optical path based on a location of an intended target. Exemplary targets may include the first collimation lens 236b, the combiner 224b, first reflector 226b, convergence lens 22b and, or, or the first scan mirror 218b. When aligning the first laser diode 206b with respect to a target, such as the first scan mirror 218b, the photodetector 254b is positioned and, or, oriented in the optical path at the intended location, position, and, or orientation of the first scan mirror 218b. Then, the alignment process for the first laser diode 206b proceeds as described herein using the alignment light source 214b in a position and, or, orientation such that the alignment beam from the alignment light source 214b passes through the laser cavity 212b of the first laser diode 206b when the first laser diode 206b is an operational configuration and travels along the optical path to register the measure at the photodetector 254b, which is positioned and, or, oriented at the location of the intended target.

Alternatively, in implementations where the first laser diode 206b is aligned with respect to a different target, such as the convergence lens 222b, the photodetector 254b is positioned and, or, oriented in the optical path at the intended location, position, and, or, orientation of the convergence lens 222b such that light from the alignment beam that passes through the laser cavity 212b will register the measure at the photodetector 254b when the first laser diode 206b is aligned with respect to the target, which in this aspect, is the convergence lens 222b. This alignment process may be repeated for the second, third and fourth laser diodes 244b, 246b, and 248b. Further, the alignment process for each diode 206, 244b, 246b, and 248b, can be performed with respect to different targets, or the same target. Further, in aspect, the photodetector 254b is not necessarily positioned at the intended location, position, and, or orientation of the intended target, but rather may be positioned and, or, oriented proximate the intended target, either upstream or downstream along the optical path from the intended target. Accordingly, one of skill in the art will appreciate that the alignment methods disclosed herein are not necessarily limited to the illustrated implementations, but rather, include aligning laser diodes with respect to intended targets in an optical system, such as a projector.

Figure 3A:
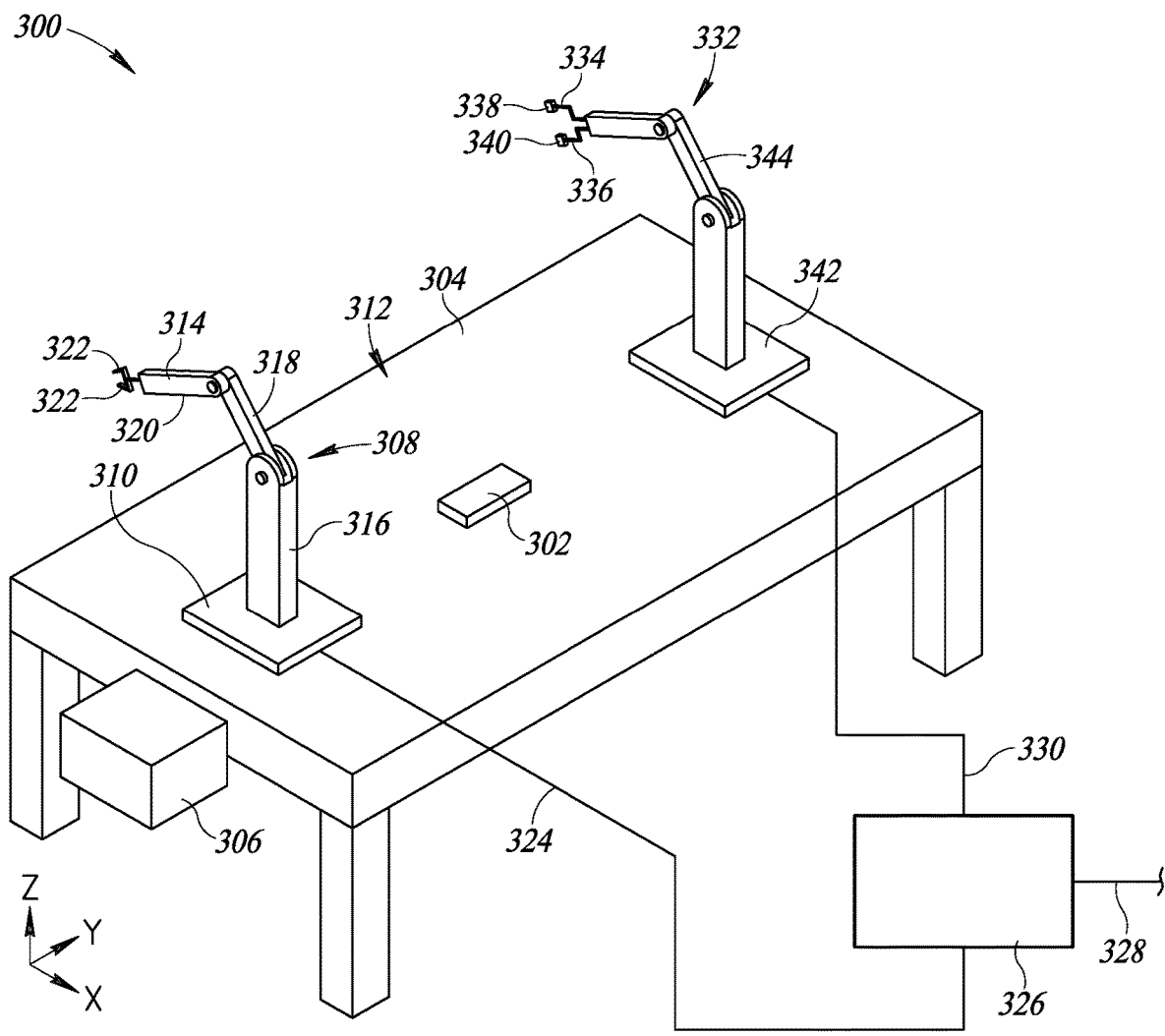
FIG. 3A is a perspective view of an exemplary automated system for assembling a laser projector, the system employing a pick and place machine for positioning and orienting a laser diode and a machine having two robotic appendages including an alignment light source and a photodetector.

FIG. 3A illustrates an exemplary automated system 300 for assembling a projector represented by block 302. In an implementation, the projector 302 is one of the projectors 100, 200a, or 200b discussed above with reference to FIGS. 1-2B. The automated system 300 includes an optical table 304. The optical table 304 includes a first surface 312 that lies in an x-y plane of the system 300. The optical table 304 further preferably includes a bin 306 coupled to the table 304, or alternatively, positioned proximate table 304 such that a pick and place machine 308 may reach into the bin 306 to grasp and move one or more devices stored in the bin 306. In an aspect, the bin includes a plurality of laser diodes, wherein each laser diode is configurable after mounting to the projector 302 to emit any one of red, green, blue, ultraviolet, or infrared laser light, as discussed herein.

The pick and place machine 308 includes a base 310 coupled to the first surface 312 of the optical table 304 and a robotic arm 314 coupled to and extending from the base 310. In an implementation, the robotic arm 314 includes a first, second, and third section 316, 318, and 320. The first section 316 is coupled to the base 310 and is translatable relative to the base 310 in the x and y directions. In an aspect, the first section 316 is also rotatable relative to the base 310 about the z-axis. The second section 318 is coupled to the first section 316a and is rotatable relative to the first section 316. The third section 320 is coupled to the second section 318 and is rotatable relative to the second section 318. A pair of robotic appendages 322, illustrated here in an open position, are translatable and rotatable relative to the third section 320. In an implementation, each arm of the pair of robotic appendages 322 is rotatable and translatable with respect to the other arm, such that the pair of robotic appendages 322 is selectively movable to a closed position, wherein the pair of the robotic appendages 322 proximate each other, or more preferably, are in contact with one another. Accordingly, the pick and place machine 308 can position the pair of robotic appendages 322 at a particular location in space in the x-y-z plane with high degrees of precision and accuracy. In other words, the pick and place machine 308 includes a wide range of poses that allows for precise manipulation of the pair of robotic appendages 322.

The pick and place machine 308 is connected to a controller 326 by line 324. In some implementations, the controller 326 is a computer including one or more processors, memories, or buses. The controller 326 includes, in an aspect, a control program to control the pick and place machine 308 and to implement methods of the present invention. The controller 326 communicates with the pick and place machine 308 via line 324. Further, the controller 326 communicates with external system components, such as an electrical power source or further network devices, via line 328. In other implementations, communication between the controller 326 and the pick and place machine 308 occurs wirelessly, with electrical power being provided to the pick and place machine 308 through an alternative line (not shown). The base 310 or the first section 316 of the pick and place machine 308 may include a memory or other components required for storing and implementing instructions received from controller 326.

In order to implement methods of the present disclosure, the pick and place machine 308 may include one or more sensors (not shown) or cameras (not shown) in order to identify, grasp, and position an object or device from the bin 306 in a precise location, position, and, or, orientation in the projector 302. In an implementation, the bin 306 includes a plurality of laser diodes and the pick and place machine 308 locates, grasps, and transports a laser diode, such as first laser diode 206b (FIG. 2B), from the bin 306 to the first location 204b (FIG. 2B). Then, a user controls the pick and place machine 308 with controller 326 until the position and, or, orientation of the laser diode is in the operating configuration, or is aligned with an optical path extending through at least a portion of the projector 302, as described herein.

The process of selecting and initially positioning a laser diode or other device from bin 306 may be automated using a program executed by controller 326 after training and, or, performing a series of initial tests. In an aspect, the initial training and testing of the pick and place machine 308 is performed by a user via the controller 326, while in other aspects, the controller 326 includes a training program for identifying objects in the bin 306 based on certain features, such as edges, corners, holes, or other "targets" that are standard among the objects in the bin 306. Once the pick and place machine 308 identifies a "target" on the device, the pick and place machine 308 grasps onto the device at detectable outer boundaries of the device and then moves the device into an initial position, and, or, orientation in the projector 302 based on programmed coordinates in the x-y-z coordinate system.

The system 300 may further include a robot 332 with a base 342 coupled to the table 304 and a robotic arm 344 coupled to the base that communicates with the controller 326 via line 330. The robotic arm 344 is translatable and rotatable relative to the base 342, similar to the pick and place machine 308. The robot 332 includes a first robotic appendage 334 and a second robotic appendage 336 coupled to and extending from the robotic arm 344. The first and second appendages 334 and 336 may be rotatable and translatable relative to the robotic arm 344. Further, the first robotic appendage 334 may be translatable relative to the second robotic appendage 336, or the robotic appendages 334 and 336 may be fixed in location relative to each other. A first device 338 is coupled to the first robotic appendage 334 and a second device 340 is coupled to the second robotic appendage 336. In an aspect, the first device 338 is a photodetector, such as photodetector 254a or 254b in FIGS. 2A-B. Alternatively, the first device 338 can be the alignment light source 214a or 214b (FIGS. 2A-B). Similarly, the second device 340 can be either a photodetector or alignment light source, depending on the characteristics of the first device 338 and, or, the application for the robot 332.

The robot 332 preferably includes a memory and other components for executing instructions received from controller 326. Accordingly, the robot 332 may be programmed to position the first and second devices 338, 340 in precise positions, locations and, or, orientations with respect to the projector 302. For example, in an implementation, the first device 338 is a photodetector (i.e. photodetector 254a in FIG. 2A) and the second device 340 is an alignment light source (i.e. alignment light source 214a in FIG. 2A). Instructions from the controller 326 executed by the memory and other internal components of the robot 332 position and, or, orient the photodetector and alignment light source in the optical path of the projector, as described herein. Further, the robot 332 may provide power to the first and second devices 338, 340, such as to the photodetector and the alignment light source.

Figure 3B:
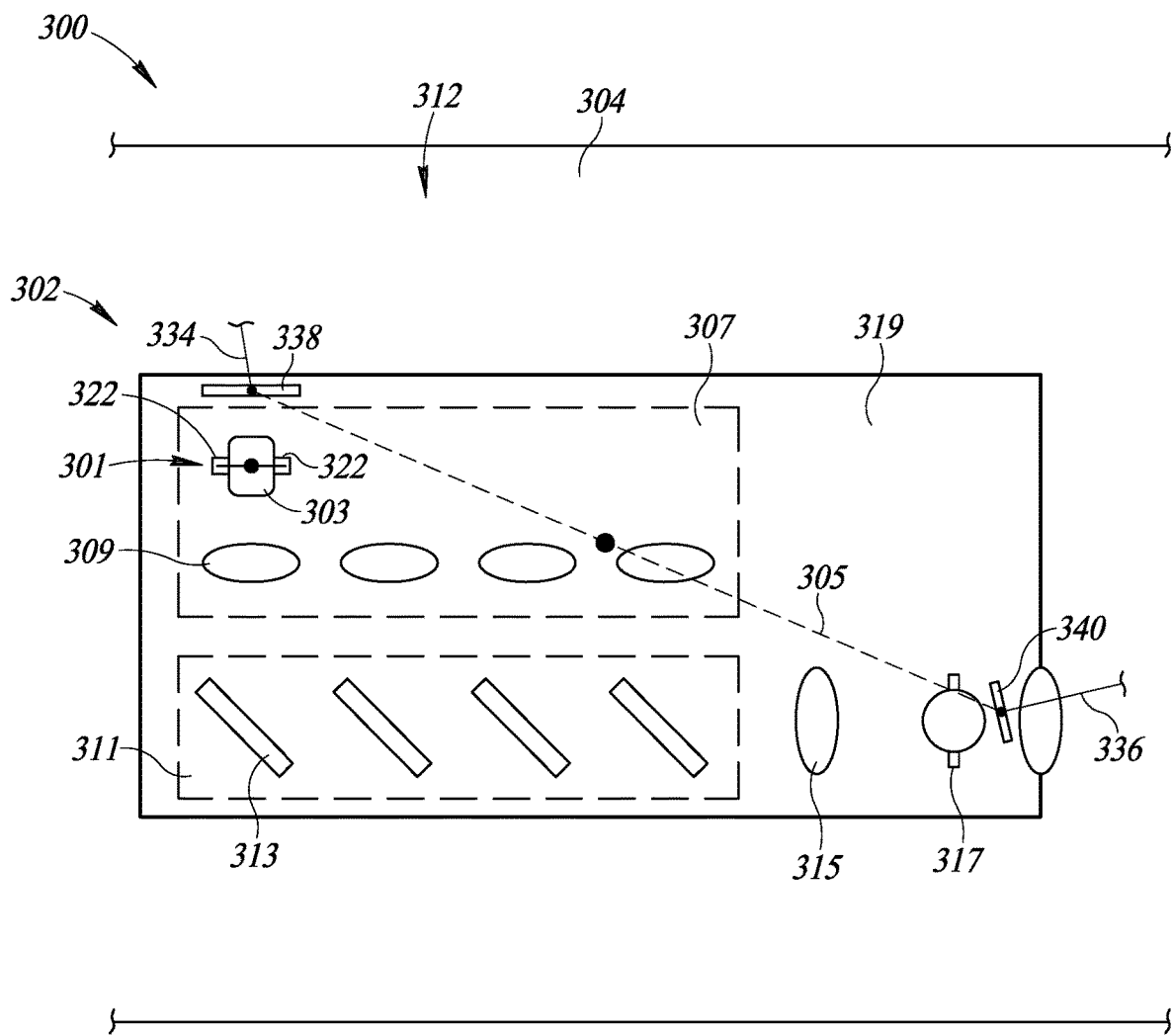
FIG. 3B is a top plan view of the system of FIG. 3A illustrating robotic appendages holding the alignment light source and photodetector in place proximate a body of a laser projector and the pick and place machine controlling the position and orientation of the first laser diode.

FIG. 3B illustrates the projector 302 of the automated system 300 in additional detail. The projector 302 is temporarily positioned, and, or oriented on the first surface 312 of the optical table 304. Similar to projectors 100, 200a, and 200b, the projector 302 includes a body 319 housing a laser module 307, a combiner 311, a convergence lens 315, and a first scan mirror 317. The laser module 307 includes at least one laser diode, such as first laser diode 303 as well as at least one collimation lens, such as first collimation lens 309. The combiner 311 further includes one or more reflectors, such as first reflector 313. The laser module 307 includes a first location 301 at which a first laser diode 303 is to be mounted. Further, an optical path extends through at least a portion of the body 319, or from at least the first location 301 to the first scan mirror 317.

In the illustrated implementation, first robotic appendage 334 holds the first device 338 in a position, and, or orientation in the optical path proximate the first location. Similarly, second robotic appendage 336 holds the second device 340 in the optical path in a position, and, or orientation proximate the first scan mirror 317. In one aspect, the first device 338 is a photodetector and the second device 340 is an alignment light source, while in other aspects the first device 338 is an alignment light source and the second device 340 is a photodetector. Alternatively, the first and second devices 338, 340 are connected by a singular robotic appendage indicated by dashed lines 305. As such, it is to be understood that a variety of different robotic appendages can be used in a variety of different poses to assist in automating the alignment methods of the present disclosure.

One of skill in the art will appreciate that the position, and, or orientation of the first and second devices 338, 340 is controllable via controller 326 (FIG. 3A). In some implementations, the position, and, or orientation is controlled by human input at the controller 326, while in other implementations, the position and, or, orientation is adjusted automatically according to a control program. For example, because the position of the first device 338 and the second device 340 may be substantially the same during assembly of projectors, such as projector 302, then the robot 332 (FIG. 3A) can be programmed to place the first and second devices 338, 340 in a position and, or, orientation that allows for alignment of the first laser diode 303 as described herein. Further, the first robotic appendage 334 can be adjusted to a second, third, or fourth location, position, and, or, orientation for mounting a second, third, and fourth laser diode according to the present disclosure.

The first laser diode 303 is initially positioned at the first location 301 by the pair of robotic appendages 322 of the pick and place machine 308 (FIG. 3A). As described above, the pair of robotic appendages 322 and, or, the pick and place machine 308 are controllable via controller 326 (FIG. 3A). As such, the position and, or, the location of the first laser diode 303 may be adjusted manually after initial positioning and, or, orienting with the pick and place machine 308, or the position and, or, orientation of the first laser diode 303 may be performed automatically by the pick and place machine 308 after initial training and testing. The description of the remaining components of projector 302 have been omitted for brevity and clarity, although one of skill in the art will appreciate that projector 302 can further include some or all of the features and components of projectors 100, 200a, and 200b.

Figure 4A:
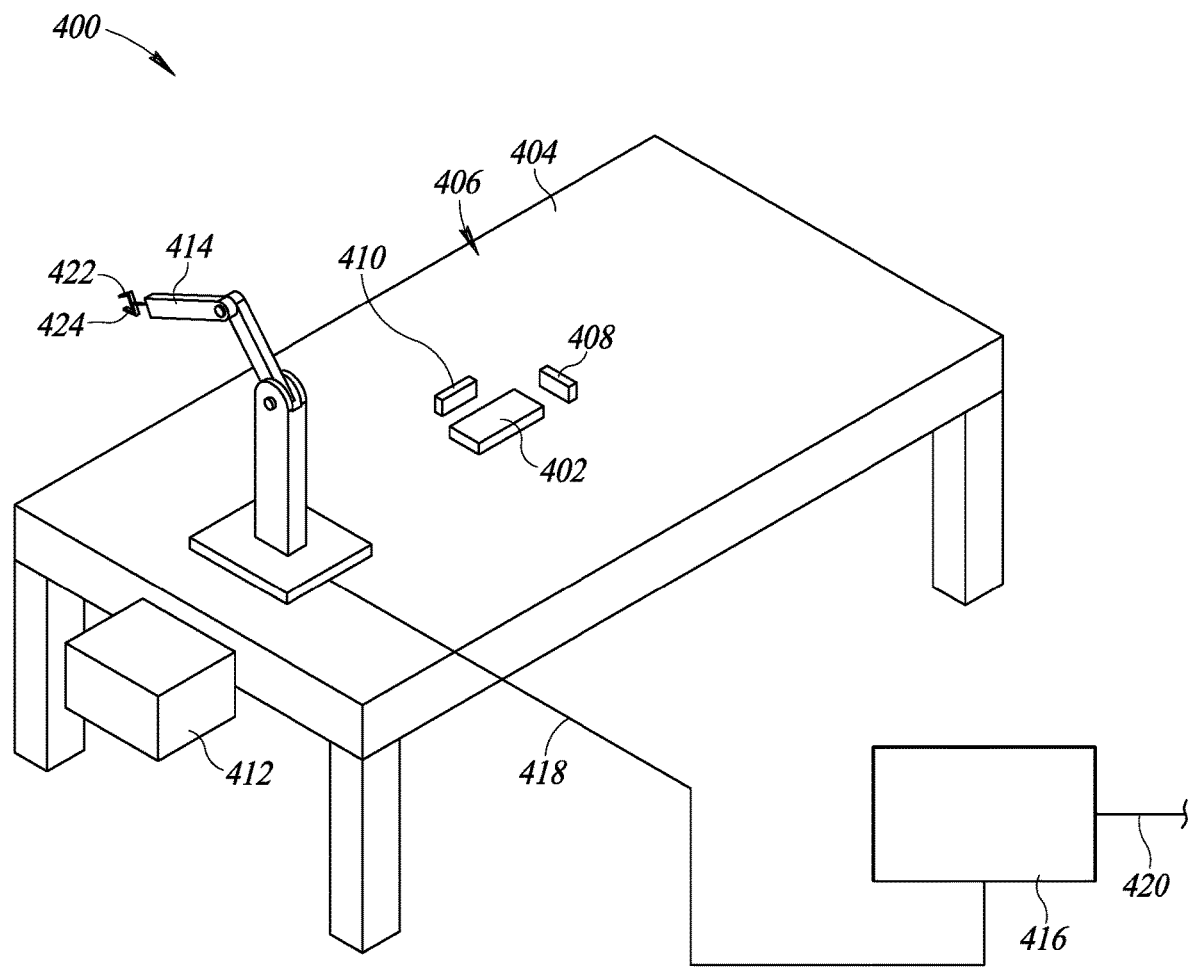
FIG. 4A is a perspective view of an exemplary automated system for assembling a laser projector, the system employing a pick and place machine for positioning and orienting a laser diode and a light table having a photodetector and alignment light source fixed in place proximate a body of the laser projector.

FIG. 4A shows an automated system 400 according to at least one illustrated implementation. The system 400 includes an optical table 404 with a first surface 406. A projector 402 to be assembled is placed on the first surface 406 in a predetermined location. Placement of the projector 402 is accomplished manually, or through the use of one or more automated machines, such as the pick and place machine 308 (FIG. 3A) or the robot 332 (FIG. 3A). Alternatively, the projector 402 may be placed on the first surface 406 in the predetermined location by a conveyor, or other device that accomplishes translation of the projector 402 with respect to the table 404.

The system 400 further includes an automated device 414. In the illustrated implementation, the automated device 414 is a pick and place machine that is substantially similar to pick and place machine 308 in FIG. 3A. The automated device 414 communicates with a controller 416 by line 418 and controller 416 communicates with external system components by line 420. In an embodiment, the controller 416 sends instructions to the automated device 414, wherein the instructions are stored and processed by a memory, processor, or other internal components of automated device 414. In practice, the automated device 414 executes commands from the controller 416 that include identifying and grasping objects from a bin 412 coupled to the table 404 with a first robotic appendage 422 and a second robotic appendage 424, which collectively create a pair of robotic appendages 422, 424. According to the instructions, the automated device 414 then transports the device to the projector 402 and initially positions the device in the projector 402, similar to pick and place machine 308 (FIG. 3A). In some implementations, the commands or instructions are provided by user inputs at the controller 416, while in other implementations, the instructions are stored and executed automatically after a user executes a command to begin assembly.

The illustrated implementation further includes a first device 408 and a second device 410 coupled to the first surface 406 of the optical table 404. The first and second devices 408, 410 are one of a photodetector or an alignment light source. For example, in an aspect, the first device 408 is an alignment light source and the second device 410 is a photodetector. In other aspects, the first device 408 is the photodetector and the second device 410 is the alignment light source. In other aspects, the optical table 404 includes multiple additional devices coupled to the first surface 406, such that projectors 402 may be assembled on the same optical table 404 without changing a position and, or, orientation of the any of the devices 408, 410, or others (not shown). Further, one of skill in the art will appreciate that because the projector 402 may be positioned on the first surface 406 in a substantially similar position and, or, orientation for assembly (i.e., the assembly process is repeatable), that the first and second devices 408, 410 may be fixed in place outside the projector 402, but in the optical path of the projector 402, as explained below.

Figure 4B:
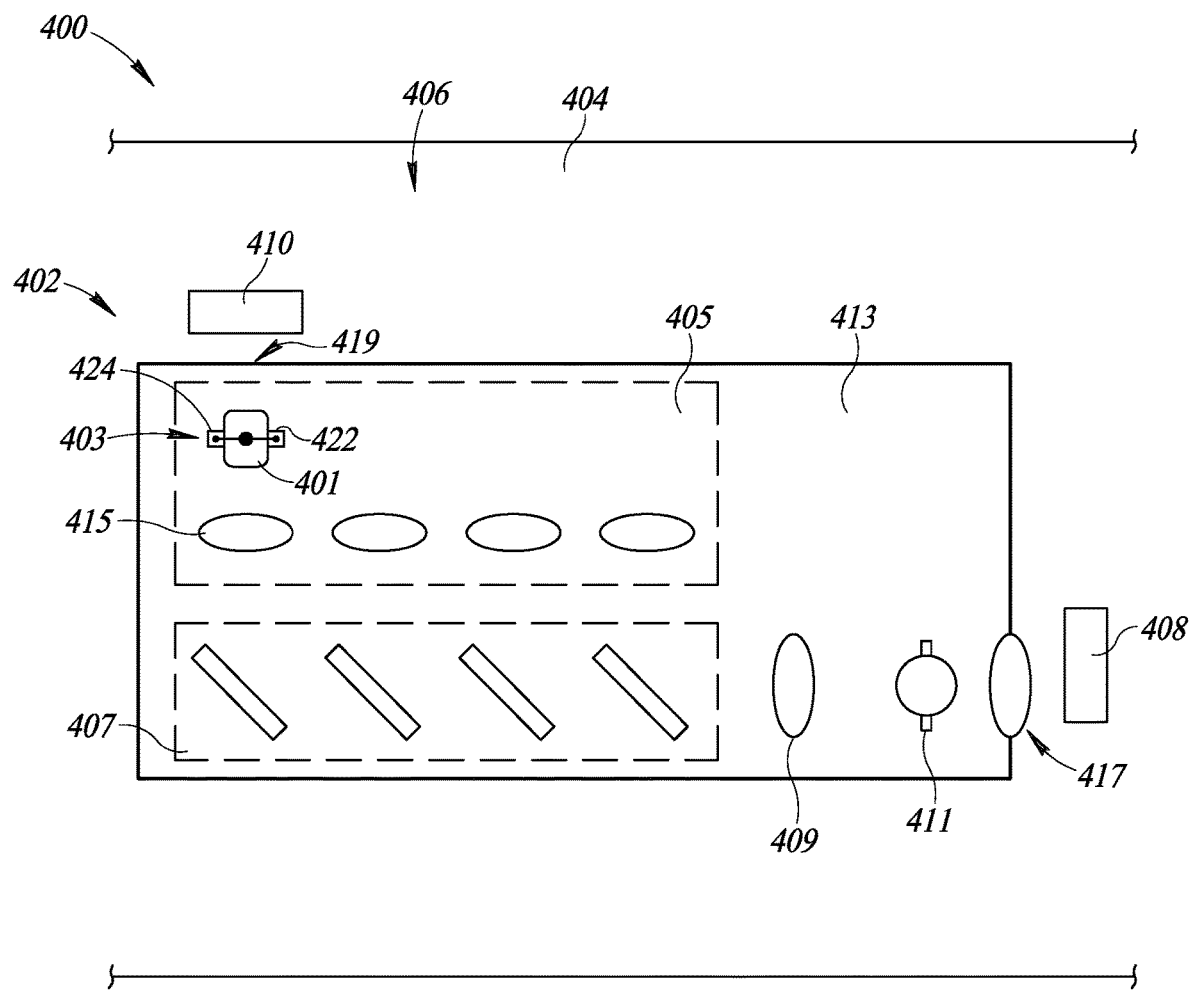
FIG. 4B is a top plan view of the system of FIG. 4A illustrating the location of the photodetector and the alignment light source with respect to the body of the laser projector in more detail.

FIG. 4B shows the system 400 illustrating the projector 402 and the first and second devices 408, 410 in additional detail. The projector 402 may be substantially similar to projectors 100, 200a, 200b, and 302 in FIGS. 1-3B. In an implementation, the projector 402 includes a body 413, a first location 403 at which a first laser diode 401 is to be mounted and an optical path extending at least through a portion of the body 413. In an aspect, the optical path includes a module 405 that includes the first location 403 and first lens 415. The optical path further includes a combiner 407, a second lens 409 and a first mirror 411.

The system 400 further includes the first device 408 and the second device 410. As described above, the first and second devices 408, 410 are preferably one of a photodetector and an alignment light source. Light that travels through the optical path passes to the devices through apertures 417, 419, which may be holes, cavities, or other spaces in the body 413. In some aspects, the aperture 417 is covered by an additional lens (not shown). Accordingly, as shown in FIG. 4B, the first and second devices 408, 410 are fixed in place on the first surface 406 of the table 404 relative to the projector 402. During assembly, the projector 402 is provided with the body 413 and the optical path described above with the first and second robotic appendages 422, 424 of the automated machine 414 (FIG. 4A) initially positioning and, or, orienting the first laser diode 401 at the first location 403. Then, the position and, or, orientation of the first laser diode 401 is adjusted until the first laser diode 401 is an operational configuration or operational position and, or, orientation, as described above with reference to FIGS. 2A-2B.

Further, one of skill in the art will appreciate that because the assembly process of a plurality of projectors having substantially the same features as projector 402 is repeatable (i.e., the position of the first and second devices 408, 410 with respect to the body 413 is substantially the same for assembly of each projector that is substantially similar to projector 402), that in an aspect, the first and second devices 408, 410 are removably coupled to the optical table 404, such that during the assembly process, the first and second devices 408, 410 are fixed with respect to a body of each projector assembled and each projector to be assembled is positioned and, or, oriented in substantially the same location.

Figure 5:
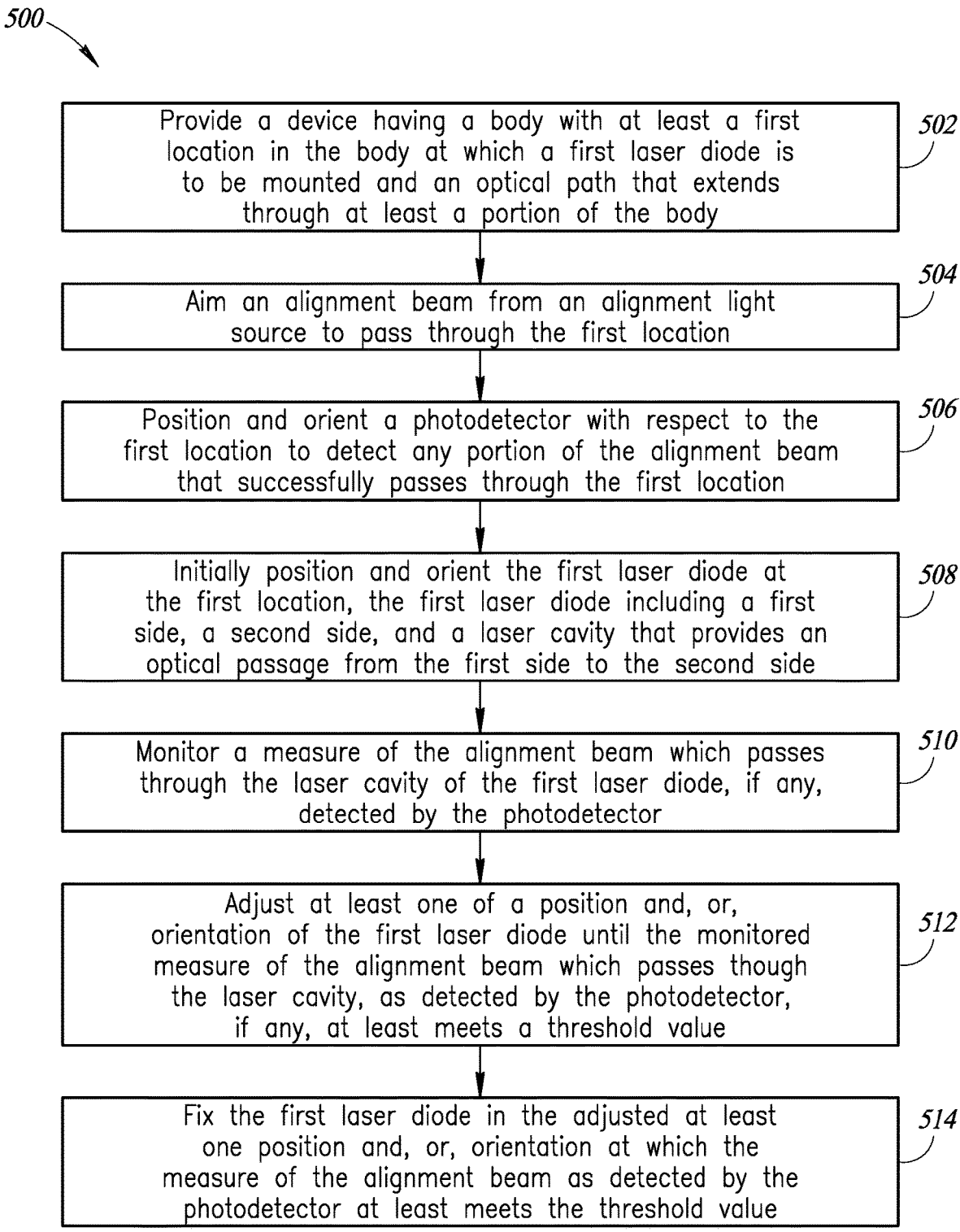
FIG. 5 is a flow diagram showing an exemplary embodiment of a method of aligning one or more laser diodes in accordance with the present disclosure.

In light of the foregoing disclosure, one of skill in the art will appreciate that a method 500 of assembling a device, such as projectors 100, 200a, 200b, 302, and 402 in FIGS. 1-4B can be represented by the flow chart in FIG. 5. More particularly, the method 500 relates to aligning laser diodes in a laser projector. The method 500 begins at 502 by providing a device, such as a laser projector, the device having a body, at least a first location in the body at which a first laser diode is to be mounted and an optical path extending through at least a portion of the body. Or in other words, the optical path extends at least from an input portion proximate the first location to an output portion of the body of the projector. The first laser diode further includes a first, a second side, and a laser cavity extending through the first laser diode that provides an optical passage from the first side to the second side of the first laser diode. In an aspect, the first side is opposite the second side on the first laser diode.

The method 500 proceeds at 504 by aiming an alignment beam produced by an alignment light source to pass through the first location at which the first laser diode is to be mounted. In an aspect, aiming the alignment beam includes positioning the alignment light source in a first position and, or, a first orientation wherein the alignment beam enters the laser cavity on the first side of the first laser diode and exits the laser cavity on the second side of the first laser diode when the first laser diode is initially positioned at the first location. In other words, light from the alignment beam is traveling in a direction along the optical path that is opposite to the direction indicated by dashed arrows in FIG. 1, which represent light propagating from the first laser diode. In aspects where the optical path includes one or more optical lenses, reflectors, and, or, a beam combiner, aiming the alignment beam at 504 includes aiming the alignment beam to successfully pass through at least one of the one or more optical lenses, reflectors, and, or, the beam combiner.

Then, at 506, a photodetector is positioned and, or, oriented with respect to the first location to detect any portion of the alignment beam that successfully passes through the first location. In certain aspects, the positioning and orienting of the photodetector includes positioning and orienting the photodetector to detect any portion of the alignment beam that passes through the laser cavity of the first laser diode from the first side to the second side of the first laser diode when the first laser diode is initially positioned at the first location.

With the alignment beam and the photodetector in place with respect to the first location, the method 500 continues at 508 by initially positioning and orienting the first laser diode at the first location. The method 500 can proceed without providing electrical power to the laser cavity of the first laser diode, wherein the laser cavity of the first laser diode acts as a passive waveguide during performance of acts of the method. Accordingly, aiming the alignment beam includes the alignment light source producing a laser alignment beam separate and distinct from a light source of the first laser diode. Then, the method 500 proceeds at 510 by monitoring a measure of the alignment beam which passes through the laser cavity of the first laser diode, if any, detected by the photodetector. In an aspect, the measure is a signal produced by the photodetector that corresponds to an amount of light received on a surface of the photodetector (i.e., the more light on the surface, the larger the signal).

At 512, the method includes adjusting at least one of a position and, or, an orientation of the first laser diode until the monitored measure of the alignment beam which passes through the laser cavity of the first laser diode from the first side to the second side, as detected by the photodetector, if any, at least meets a threshold value. Finally, once the threshold value is detected at the photodetector, the method 500 includes at 514 fixing the first laser diode in the adjusted at least one position and, or, orientation at which the measure of the alignment beam as detected by the photodetector at least meets the threshold value. In other words, the final act of the method is fixing the first laser diode in place at the adjusted position and, or, orientation where the photodetector at least registers the minimum threshold value of the measure. More preferably, the first laser diode is fixed in place at a position and, or, an orientation that corresponds to the threshold value being a maximum value of a range of measures provided by the photodetector. The maximum value corresponds to the maximum amount of light from the alignment beam and alignment light source that can propagate through the system and impinge upon the photodetector. Accordingly, the method 500 includes 12 adjusting at least one of the position and, or, the orientation of the first laser diode includes adjusting at least one of the position and, or, the orientation of the first laser diode until the threshold value is an absolute maximum value.

In certain aspects disclosed herein, the method 500 further includes positioning the alignment light source in a second position and, or, a second orientation wherein the alignment beam enters the laser cavity on the second side of the first laser diode and exits the laser cavity on the first side of the first laser diode when the first laser diode is initially positioned at the first location as in FIG. 2B. In this aspect of the method 500, aiming the alignment beam includes placing the alignment light source in a position and, or, an orientation such that the alignment beam travels along the optical path in the same, or first direction, as indicated by dashed arrows in FIG. 1. In other words, in this aspect, the alignment beam follows the same path as light from the first laser diode when it is positioned in an operational configuration, position, and, or orientation. In such aspects, the method 500 may further include positioning and orienting the photodetector to detect any portion of the alignment beam that passes through the laser cavity of the first laser diode from the second side to the first side of the first laser diode when the first laser diode is initially positioned at the first location, as described above with reference to FIG. 2B.

As described above in FIGS. 3A-4B, the method 500 can further include utilizing a pick and place machine to perform at least one of initially positioning and orienting the first laser diode, and, or, adjusting at least one of the position and, or, the orientation of the first laser diode. Further, the method 500 can include aiming the alignment beam with a first robotic appendage and positioning and orienting the photodetector via a second robotic appendage wherein the robotic appendages are capable of holding various poses with respect to each other. Alternatively, the method 500 can include aiming the alignment beam and positioning and orienting the photodetector via a first, singular, unitary, integrated robotic appendage. In such an aspect, a first singular robotic appendage is provided with both the photodetector and the alignment light source coupled to an extending from the first robotic appendage and positioned and, or, oriented with respect to each other such that the photodetector and the alignment light source are in a position and, or, an orientation for alignment of one or more laser diodes.

Further, as described above with reference to FIGS. 1-4B, acts of the method can be repeated at a second location where a second laser diode is to be mounted as well as at a third and fourth location where a third and fourth laser diode are to be mounted, respectively. In an aspect where at least a first and second laser diode are mounted in the projector, adjusting at least one of the position and, or, the orientation of the first laser diode and adjusting at least one of the position and, or, the orientation of the second laser diode includes orienting the laser cavity of the first laser diode and orienting the laser cavity of the second laser diode to produce substantially collinear beams.

Figure 6:
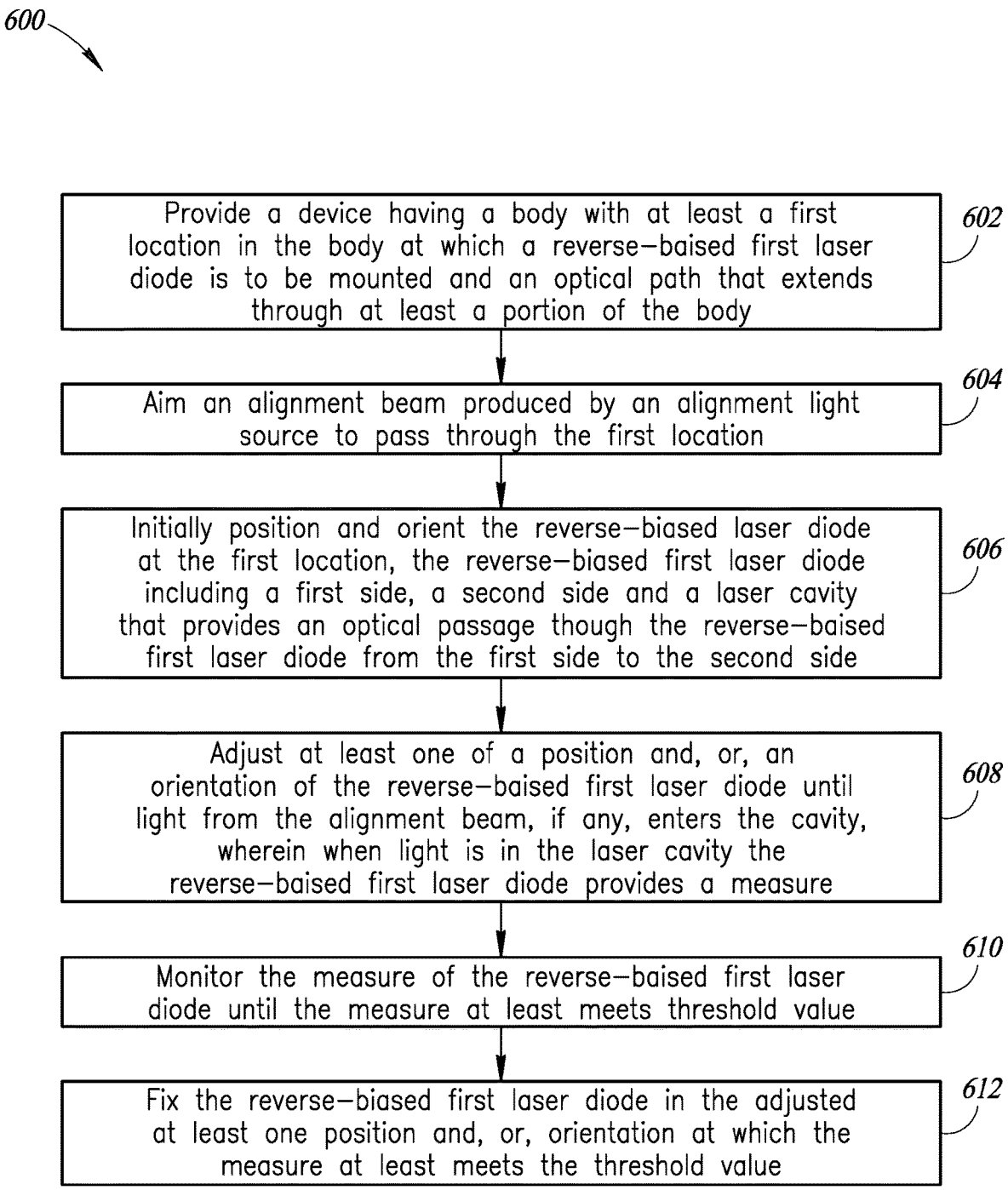
FIG. 6 is a flow diagram showing an alternative exemplary embodiment of a method of aligning one or more laser diodes in accordance with the present disclosure.

One of skill in the art will further understand that an alternative method 600 for assembly of a device, such as projectors 100, 200a, 200b, 302, and 402 in FIGS. 1-4B can be represented by the flow chart in FIG. 6. The method 600 beings at 602 by providing a device, such as a laser projector, having a body and a first location at which a reverse-biased first laser diode is to be mounted in the body, and an optical path that extends through at least a portion of the body. The method continues at 604 by aiming an alignment beam produced by an alignment light source to pass through the first location at which the first laser diode is to be mounted. Then, the reverse-biased first laser diode is initially positioned and oriented at the first location as in 606 of the method 600. The initial positioning and, or, orienting includes the reverse-biased first laser diode including a first side, a second side and a laser cavity that provides an optical passage through the reverse-biased first laser diode from the first side to the second side thereof.

At 608, the position and, or, orientation of the reverse-biased first laser diode is adjusted until light from the alignment beam, if any, enters the laser cavity, wherein when light from the alignment beam is in the laser cavity, the reverse-biased first laser diode provides a measure, as described above with reference to FIG. 2A. In an implementation, the measure is a signal provided by the reverse-biased first laser diode when electrical power is provided to the reverse-biased first laser diode during alignment. The method 600 continues at 608 wherein at least one of a position, and, or, an orientation of the reverse-biased first laser diode is adjusted until light from the alignment beam, if any, enters the laser cavity, wherein when light from the alignment beam is in the laser cavity the reverse-biased first laser diode provides a measure. In an aspect, the alignment beam is a laser alignment beam and the measure is a signal that varies in strength according to the amount of light from the alignment beam that is in the laser cavity.

At 610, the measure is monitored until the measure at least meets a threshold value. In an implementation, monitoring the measure includes monitoring the measure, or signal, until the measure is an absolute maximum or minimum value (i.e., if the measure provides a negative value due to the reverse-biasing of the first laser diode), or until the measure corresponds to a maximum magnitude of the threshold value. Then, at 612, the reverse-biased first laser diode is fixed in place at the adjusted at least one position and, or, orientation at which the measure at least meets the threshold value. One of skill in the art will appreciate that at 612, the fixing can include fixing the reverse-biased first laser diode in place at an adjusted position and, or, orientation that corresponds to the value being an absolute minimum value.

As described above with reference to FIG. 2A, the method 600 at 608 can include, in an aspect, providing electrical power to the reverse-biased first laser diode while adjusting at least one of the position and, or orientation of the same. Further, in accordance with the present disclosure, the optical path of the device can include one or more optical lenses, reflectors, and, or, a beam combiner and aiming the alignment beam at 604 can include aiming the alignment beam to successfully pass through at least one of the one or more optical lenses, reflectors, and, or, the beam combiner. Any, or all, of the above acts of the method 600 can be repeated at a second, third, or fourth location at which a reverse-biased second, third, or fourth laser diode, respectively, is to be mounted in the projector. In method 600, aiming the alignment beam at 604 can include the alignment light source producing singular light beams, such as a red, green, blue, ultraviolet, or infrared light beam, or the aiming the alignment beam at 604 can include the alignment light source producing an aggregate alignment beam including at least two of red, green, blue, ultraviolet, and infrared light beams wherein the beam combiner (such as combiner 224a in FIG. 2A) separates the aggregate alignment beam into separate at least two of red, green, blue, ultraviolet, and infrared light beams.

Accordingly, methods and devices of the present disclosure provide for a simplified method of aligning laser diodes in a laser projector system that is efficient in terms of time and cost, and that also allows for automation without the use of expensive and complex machinery. For example, because electrical power is not required for practicing certain acts of the methods disclosed herein, less complex and expensive machinery may be used when manually aligning the diodes, or when automating the assembly process. Further, the process of alignment is simplified by the laser diodes acting as waveguides because the proper position and, or, orientation of the diodes is indicated by the measure.

A person of skill in the art will appreciate that the present systems, devices, and methods may be applied or otherwise incorporated into projector architectures that employ one or more light source(s) other than a laser. For example, in some implementations one or more laser(s) in a projector described herein may be replaced by another light source, such as a light source comprising one or more light-emitting diodes ("LEDs"), and/or one or more organic LEDs ("OLEDs"). Such non-laser implementations may advantageously employ additional optics to collimate, focus, and/or otherwise direct projected light signals. Unless the specific context requires otherwise, a person of skill in the art will appreciate that references to a "SLP" throughout the present systems, devices, and methods are generic to other light sources (combined with other optics, as necessary) that may be applied or adapted for application to accomplish the same general function(s) associated with the SLPs described herein.

A person of skill in the art will appreciate that the present systems, devices, and methods may be applied or otherwise incorporated into WHUD architectures that employ one or more transparent combiner(s) other than a holographic combiner. For example, in some implementations the holographic combiner described herein may be replaced by a non-holographic device that accomplishes substantially the same general function(s), such as prismatic film, a film that carries a microlens array, and/or a waveguide structure. Such non-holographic implementations may or may not employ additional optics. Unless the specific context requires otherwise, a person of skill in the art will appreciate that references to a "holographic combiner" throughout the present systems, devices, and methods are generic to other transparent combiners (combined with other optics, as necessary) that may be applied or adapted for application to accomplish the same general function(s) associated with the holographic combiners described herein.

A person of skill in the art will appreciate that the various embodiments for focusing laser projectors described herein may be applied in non-WHUD applications. For example, the present systems, devices, and methods may be applied in non-wearable heads-up displays and/or in other projector applications that may or may not include a visible projected display.

In some implementations, one or more optical fiber(s) may be used to guide light signals along some of the paths illustrated herein.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet which are owned by Thalmic Labs Inc., including but not limited to: U.S. Provisional Patent Application Ser. No. 62/322,128, US Patent Application Publication No. US 2015-0378161 A1, U.S. Non-Provisional patent application Ser. No. 15/046,234, U.S. Non-Provisional patent application Ser. No. 15/046,254, U.S. Non-Provisional patent application Ser. No. 15/046,269, U.S. Provisional Patent Application Ser. No. 62/156,736, U.S. Non-Provisional patent application Ser. No. 15/145,576, US Patent Application Publication No. US 2016-0327797 A1, US Patent Application Publication No. US 2016-0327796 A1, U.S. Provisional Patent Application Ser. No. 62/214,600, US Patent Application Publication No. US 2017-0068095 A1, U.S. Provisional Patent Application Ser. No. 62/167,767, U.S. Provisional Patent Application Ser. No. 62/271,135, US Patent Application Publication No. US 2016-0349514 A1, U.S. Provisional Patent Application Ser. No. 62/245,792, U.S. patent application Ser. No. 15/331,204, U.S. Provisional Patent Application Ser. No. 62/438,725, U.S. Non-Provisional patent application Ser. No. 14/155,087, U.S. Non-Provisional patent application Ser. No. 14/155,107, PCT Patent Application PCT/US2014/057029, US Patent Application Publication No. US 2015-0370326 A1, U.S. Provisional Patent Application Ser. No. 62/236,060, US Patent Application Publication No. US 2017-0097753 A1, U.S. Provisional Patent Application Ser. No. 62/420,368, and U.S. Provisional Patent Application Ser. No. 62/641,055, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of assembly for a device having a body, at least a first location at which a first laser diode is to be mounted, and an optical path that extends through at least a portion of the body, the method comprising:
    aiming an alignment beam produced by an alignment light source to pass through the first location at which the first laser diode is to be mounted;
    positioning and orienting a photodetector with respect to the first location at which the first laser diode is to be mounted to detect any portion of the alignment beam that successfully passes through the first location;
    initially positioning and orienting the first laser diode at the first location, the first laser diode including a first side, a second side, and a laser cavity that provides an optical passage through the first laser diode from the first side to the second side thereof;
    monitoring a measure of the alignment beam which passes through the laser cavity of the first laser diode, if any, detected by the photodetector;
    adjusting at least one of a position and, or, an orientation of the first laser diode until the monitored measure of the alignment beam which passes through the laser cavity of the first laser diode from the first side to the second side, as detected by the photodetector, if any, at least meets a threshold value; and
    fixing the first laser diode in the adjusted at least one position and, or, orientation at which the measure of the alignment beam as detected by the photodetector at least meets the threshold value.

2. The method of claim 1 wherein aiming the alignment beam includes positioning the alignment light source in a first position and, or, a first orientation wherein the alignment beam enters the laser cavity on the first side of the first laser diode and exits the laser cavity on the second side of the first laser diode when the first laser diode is initially positioned at the first location.

3. The method of claim 2 wherein positioning and orienting the photodetector includes positioning and orienting the photodetector to detect any portion of the alignment beam that passes through the laser cavity of the first laser diode from the first side to the second side of the first laser diode when the first laser diode is initially positioned at the first location.

4. The method of claim 1 wherein aiming the alignment beam includes positioning the alignment light source in a second position and, or, a second orientation wherein the alignment beam enters the laser cavity on the second side of the first laser diode and exits the laser cavity on the first side of the first laser diode when the first laser diode is initially positioned at the first location.

5. The method of claim 4 wherein positioning and orienting the photodetector includes positioning and orienting the photodetector to detect any portion of the alignment beam that passes through the laser cavity of the first laser diode from the second side to the first side of the first laser diode when the first laser diode is initially positioned at the first location.

6. The method of claim 1 wherein initially positioning and orienting the first laser diode at the first location includes operating the laser cavity as a passive waveguide.

7. The method of claim 6 wherein aiming the alignment beam includes the alignment light source producing a laser alignment beam separate and distinct from a light source of the first laser diode.

8. The method of claim 1 wherein no electrical power is supplied to the first laser diode while acts of the method occur.

9. The method of claim 1 further comprising utilizing a pick and place machine to perform at least one of initially positioning and orienting the first laser diode, and, or, adjusting at least one of the position and, or, the orientation of the first laser diode.

10. The method of claim 1 wherein the optical path further includes one or more optical lenses, reflectors, and, or, a beam combiner and aiming the alignment beam includes aiming the alignment beam to successfully pass through at least one of the one or more optical lenses, reflectors, and, or, the beam combiner.

11. The method of claim 1 wherein acts of the method are repeated for a second location at which a second laser diode is to be mounted, adjusting at least one of the position and, or, the orientation of the first laser diode and adjusting at least one of the position and, or, the orientation of the second laser diode includes orienting the laser cavity of the first laser diode and orienting the laser cavity of the second laser diode to produce collinear beams.

12. The method of claim 1 wherein adjusting at least one of the position and, or, the orientation of the first laser diode includes adjusting at least one of the position and, or, the orientation of the first laser diode until the threshold value is an absolute maximum value.

13. The method of claim 1 wherein aiming the alignment beam includes aiming the alignment beam with a first robotic appendage and wherein positioning and orienting the photodetector includes positioning and orienting the photodetector via a second robotic appendage.

14. The method of claim 1 wherein aiming the alignment beam and positioning and orienting the photodetector includes aiming the alignment beam and positioning and orienting the photodetector via a first robotic appendage.

15. A method of assembly for a device having a body, at least a first location at which a reverse-biased first laser diode is to be mounted, and an optical path that extends through at least a portion of the body, the method comprising:

aiming an alignment beam produced by an alignment light source to pass through the first location at which the reverse-biased first laser diode is to be mounted;

initially positioning and orienting the reverse-biased first laser diode at the first location, the reverse-biased first laser diode including a first side, a second side and a laser cavity that provides an optical passage through the reverse-biased first laser diode from the first side to the second side thereof;

adjusting at least one of a position, and, or, an orientation of the reverse-biased first laser diode until light from the alignment beam, if any, enters the laser cavity, wherein when light from the alignment beam is in the laser cavity the reverse-biased first laser diode provides a measure;

monitoring the measure of the reverse-biased first laser diode until the measure at least meets a threshold value; and fixing the reverse-biased first laser diode in the adjusted at least one position, and, or, orientation at which the measure at least meets the threshold value.

16. The method of claim 15 wherein monitoring the measure of the reverse-biased first laser diode until the measure at least meets a threshold value includes the threshold value being an absolute minimum value.

17. The method of claim 15 wherein adjusting at least one of the position, and, or, the orientation of the reverse-biased first laser diode includes providing electrical power to the reverse-biased first laser diode.

18. The method of claim 15 wherein the optical path further includes one or more optical lenses, reflectors, and, or, a beam combiner and aiming the alignment beam includes aiming the alignment beam to successfully pass through at least one of the one or more optical lenses, reflectors, and, or, the beam combiner.

19. The method of claim 18 wherein acts of the method are repeated at a second location at which a reverse-biased second laser diode is to be mounted.

20. The method of claim 19 wherein aiming the alignment beam includes the alignment light source producing an aggregate alignment beam including at least two of red, green, blue, ultraviolet, and infrared light beams, the beam combiner separating the aggregate alignment beam into separate at least two of red, green, blue, ultraviolet, and infrared light beams.

* * * * *